(12) United States Patent
Wada et al.

(10) Patent No.: US 10,353,007 B2
(45) Date of Patent: Jul. 16, 2019

(54) RECHARGEABLE BATTERY PARAMETER ESTIMATION APPARATUS AND RECHARGEABLE BATTERY PARAMETER ESTIMATION METHOD FOR CALCULATING FIRST AND SECOND COEFFICIENTS WHICH ARE PARTIAL DERIVATIVES OF AN ESTIMATED VALUE OF THE BATTERY STATE-OF-CHARGE

(71) Applicants: MITSUBISHI ELECTRIC CORPORATION, Chiyoda-ku (JP); MITSUBISHI ELECTRIC RESEARCH LABORATORIES, INC., Cambridge, MA (US)

(72) Inventors: Toshihiro Wada, Chiyoda-ku (JP); Tomoki Takegami, Chiyoda-ku (JP); Yebin Wang, Cambridge, MA (US); Taesic Kim, Cambridge, MA (US); Zafer Sahinoglu, Cambridge, MA (US)

(73) Assignees: Mitsubishi Electric Corporation, Chiyoda-ku (JP); Mitsubishi Electric Research Laboratories, Inc., Cambridge, MA (US)

( * ) Notice: Subject to any disclaimer, the term of this patent is extended or adjusted under 35 U.S.C. 154(b) by 430 days.

(21) Appl. No.: 14/724,102

(22) Filed: May 28, 2015

(65) Prior Publication Data
US 2016/0349329 A1    Dec. 1, 2016

(51) Int. Cl.
*G01R 13/36* (2006.01)
*G01R 31/36* (2019.01)
(Continued)

(52) U.S. Cl.
CPC ....... *G01R 31/3648* (2013.01); *G01R 31/367* (2019.01); *G01R 31/382* (2019.01); *G01R 35/04* (2013.01)

(58) Field of Classification Search
CPC combination set(s) only.
See application file for complete search history.

(56) References Cited

U.S. PATENT DOCUMENTS

2013/0013238 A1* 1/2013 Kawakita ............... H02J 7/044
                                                              702/63
2013/0229154 A1* 9/2013 Benjamin .......... G01R 31/3606
                                                              320/132

FOREIGN PATENT DOCUMENTS

JP    2012-057964    3/2012
JP    2012-058028    3/2012

OTHER PUBLICATIONS

Da-Zheng Feng, et al., "A Fast Recursive Total Least Squares Algorithm for Adaptive FIR Filtering", IEEE Transactions on Signal Processing, vol. 52, (10), 2004, pp. 2729-2737.

* cited by examiner

*Primary Examiner* — Gene N Auduong
(74) *Attorney, Agent, or Firm* — Oblon, McClelland, Maier & Neustadt, L.L.P.

(57) ABSTRACT

The rechargeable battery parameter estimation apparatus includes: a current measurement part for measuring a current flowing through a rechargeable battery, the current measurements having an offset error; a first coefficient calculation part for calculating a first coefficient, which is a partial derivative of an estimated value of an state of charge (SoC) of the battery with respect to the offset error; a second coefficient calculation part for calculating a second coefficient, which is a partial derivative of the estimated value of the SoC with respect to a capacity error, which is a difference of a typical full charge capacity from an actual full charge capacity of the battery; and an error estimation part for estimating the offset error and the capacity error from derivative information including the first coefficient and the (Continued)

second coefficient, the current flowing through the battery, and the estimated value of the SoC.

22 Claims, 29 Drawing Sheets

(51) Int. Cl.
 *G01R 31/382* (2019.01)
 *G01R 31/367* (2019.01)
 *G01R 35/04* (2006.01)

US 10,353,007 B2

RECHARGEABLE BATTERY PARAMETER ESTIMATION APPARATUS AND RECHARGEABLE BATTERY PARAMETER ESTIMATION METHOD FOR CALCULATING FIRST AND SECOND COEFFICIENTS WHICH ARE PARTIAL DERIVATIVES OF AN ESTIMATED VALUE OF THE BATTERY STATE-OF-CHARGE

BACKGROUND OF THE INVENTION

1. Field of the Invention

The present invention relates to a rechargeable battery parameter estimation apparatus and a rechargeable battery parameter estimation method for estimating an offset error of measurements of a current flowing through a rechargeable battery, and estimating a capacity error, which is a difference of a typical full charge capacity (FCC) of the battery measured in advance from an actual FCC of the battery at a time when the battery is in use.

2. Description of the Related Art

In order to efficiently use a rechargeable battery such as a lithium-ion battery, a nickel metal-hydride battery, and a lead-acid battery, it is indispensable to highly precisely estimate a state of charge (SoC) of the battery. However, the SoC of the battery is not a physical quantity that is directly measurable, and hence the SoC has to be estimated from a current flowing through the battery, a voltage between terminals of the battery, measurements of the battery temperature, and histories of these physical quantities. As the most basic methods for estimating the SoC of the battery, the open circuit voltage method and the Coulomb-counting method are known.

The open circuit voltage method is a method in which a rechargeable battery is leaved out offline, and the voltage between terminals of the battery which sufficiently reaches the thermodynamic equilibrium, namely, an open circuit voltage (OCV), is measured, then the SoC of the battery is calculated on the basis of a dependence of the OCV on the SoC, which is determined in advance. Therefore, the battery has to be suspended for a long period during the SoC estimation by means of the open circuit voltage method.

On the other hand, the Coulomb-counting method is a method in which the current flowing through the battery is integrated, and the integrated current is divided by an FCC of the battery, to thereby calculate a change in the SoC from the integration start time. The Coulomb-counting method is capable of estimating the SoC even while the battery is online, by considering a state in which the SoC is apparent, that is, a state in which the battery is fully charged or fully discharged as a reference. However, the Coulomb-counting method has such a problem that an estimation accuracy of the SoC is greatly degraded by a small off set error of the current measurements, which is inevitable in widely used Hall effect sensors.

As a related-art apparatus using the Coulomb-counting method, there is disclosed a battery charging rate estimation apparatus, in which a rechargeable battery is assumed as a linear system based on an equivalent circuit model of the battery, the current flowing through the battery is assumed as an input of the linear system, and the voltage between the terminals of the battery is assumed as an output of the linear system; a Kalman filter is then constructed on the basis of an extended system in which the offset error of the current measurements is appended to the state of the linear system, to thereby precisely estimate the SoC of the battery and the offset error of the current measurements (for example, refer to Japanese Patent Application Laid-open No. 2012-57964).

As a related-art apparatus combining the open circuit voltage method and the Coulomb-counting method, there is disclosed a battery capacity calculation apparatus in which a current flowing through a rechargeable battery is integrated only in a period in which an absolute value of the current flowing through the battery is equal to or more than a certain value and the influence of the offset error of current measurements is thus relatively small, and comparing changes in the SoC with that in the integrated current in this period, to thereby estimate the FCC of the battery (for example, refer to Japanese Patent Application Laid-open No. 2012-58028).

According to Japanese Patent Application Laid-open No. 2012-58028, the SoC is estimated from the OCV, and the OCV is acquired by means of recursive calculation based on an equivalent circuit of the battery. Characteristic parameters of the equivalent circuit are adjusted by an adaptive mechanism from transitions of the current flowing through the battery and the voltage between terminals of the battery. As a result, the influence of the offset error of the current measurements is affirmed to be decreased by limiting the current integration period to the period in which the absolute value of the current is equal to or more than the certain value.

However, the related arts have the following problems.

According to Japanese Patent Application Laid-open No. 2012-57964, the typical FCC of the battery and the characteristic parameters of the equivalent circuit are considered to be known, and hence there is such a problem that when the typical FCC of the battery and the characteristic parameters of the equivalent circuit have errors, those errors propagate to the estimated value of the SoC and that of the offset error of the current measurements.

On the other hand, according to Japanese Patent Application Laid-open No. 2012-58028, the current flowing through the battery, which includes an offset error, is referred to by the adaptive mechanism for adjusting the characteristic parameters of the equivalent circuit. The characteristic parameters of the equivalent circuit thus has an error caused by the offset error. This error propagates to the estimated value of the OCV, which is calculated in a manner that depends on the characteristic parameters of the equivalent circuit, further to the estimated value of the SoC, and finally to the estimated value of the FCC of the battery.

Further, for example, even if the FCC of the battery is estimated by using the technology disclosed in Japanese Patent Application Laid-open No. 2012-58028, and the offset error of the current measurements is estimated by using the estimated value of the FCC by means of the method disclosed in Japanese Patent Application Laid-open No. 2012-57964, the estimated value of the offset error is superimposed with an error caused by the actual offset error of the current measurements, and hence the correct value of the offset error cannot be obtained.

As described above, in the related-art apparatuses, there is such a problem that the FCC of a rechargeable battery cannot be correctly estimated as long as the measurements of the current flowing through the battery have an offset error, because the error caused by the offset error propagates the estimated value of the FCC of the battery.

SUMMARY OF THE INVENTION

The present invention has been made in view of the above-mentioned problem, and therefore has an object to provide a rechargeable battery parameter estimation apparatus and a rechargeable battery parameter estimation method that are capable of highly precisely estimating an offset error of measurements of a current flowing through a rechargeable battery and a capacity error, which is a difference of a typical full charge capacity (FCC) of the battery measured in advance from an actual FCC of the battery at a time when the battery is in use even if the current measurements have an offset error.

According to one embodiment of the present invention, there is provided a rechargeable battery parameter estimation apparatus, including: a voltage measurement part for measuring a voltage between terminals of the battery; an SoC estimation part for estimating an estimated value of the SoC of the battery in a manner that depends on a typical FCC of the battery measured in advance and the voltage between the terminals of the battery, the typical FCC has a capacity error; a current measurement part for measuring a current flowing through the battery, the measurements of the current has an offset error; a first coefficient calculation part for calculating a first coefficient, which is a partial derivative of the estimated value of the SoC with respect to the offset error of the current measurements; a second coefficient calculation part for calculating a second coefficient, which is a partial derivative of the estimated value of the SoC with respect to the capacity error, which is a difference of the typical FCC measured in advance from an actual FCC of the battery at the battery in use; and an error estimation part for estimating the offset error of the current measurements and the capacity error of the FCC from derivative information including the first coefficient and the second coefficient, the current flowing through the battery, and the estimated value of the SoC.

According to one embodiment of the present invention, there is provided a rechargeable battery parameter estimation method, including: measuring a voltage between terminals of the battery; estimating an estimated value of the SoC of the battery in a manner that depends on a typical FCC of the battery measured in advance and the voltage between the terminals of the battery, the typical FCC has a capacity error; measuring a current flowing through the battery, the measurements of the current has an offset error; calculating a first coefficient, which is a partial derivative of the estimated value of the SoC with respect to the offset error of the current measurements; calculating a second coefficient, which is a partial derivative of the estimated value of the SoC with respect to the capacity error, which is a difference of the typical FCC measured in advance from an actual FCC of the battery at the battery in use; and estimating the offset error of the current measurements and the capacity error of the FCC from derivative information including the first coefficient and the second coefficient, the current flowing through the battery, and the estimated value of the SoC.

According to the one embodiment of the present invention, assuming either one or both of the current measurements and the typical FCC have errors, the errors are estimated from the estimated value of the SoC, which is estimated from the measurements of the voltage between the terminals of the battery. As a result, it is possible to provide the rechargeable battery parameter estimation apparatus and the rechargeable battery parameter estimation method that are capable of highly precisely estimating the offset error of the current measurements and the capacity error of the FCC, even if the measurements of the current have an offset error.

DETAILED DESCRIPTION OF THE PREFERRED EMBODIMENTS

Figure 1:
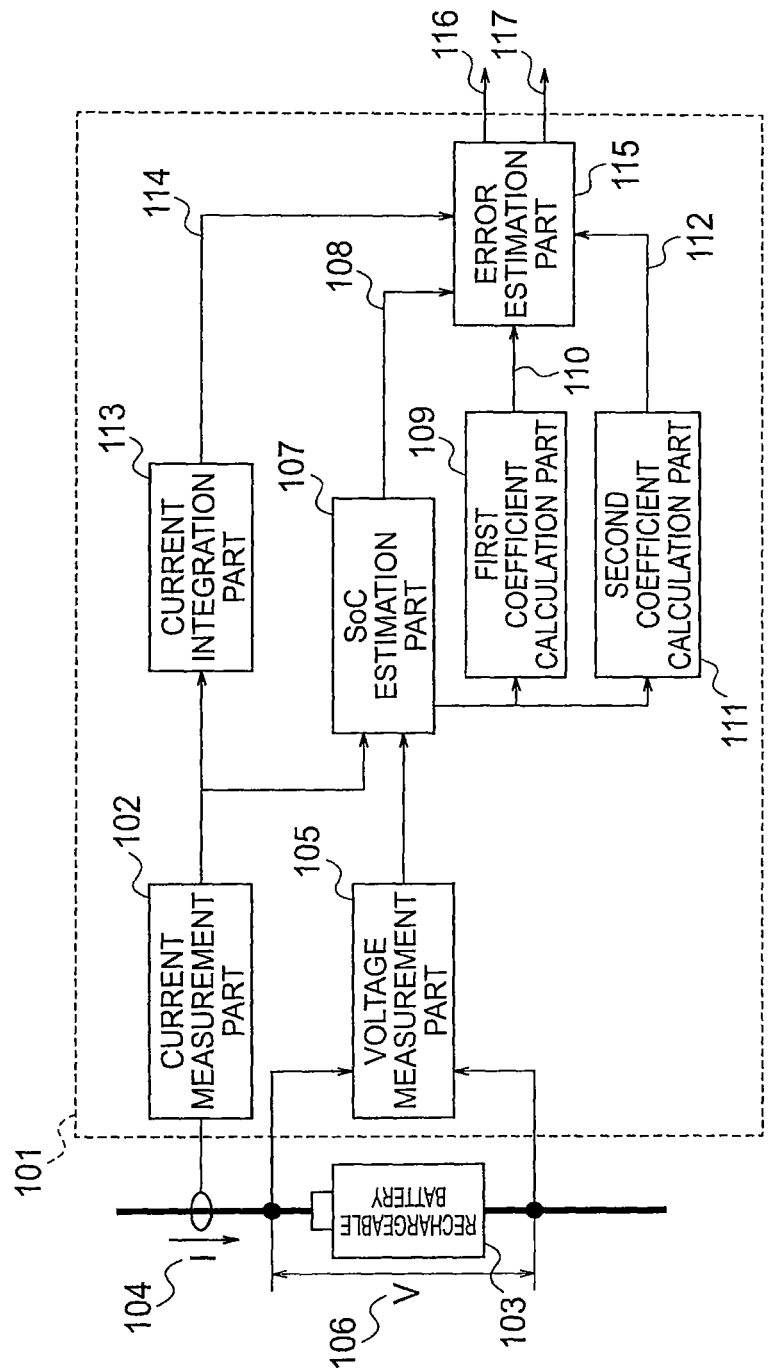
FIG. 1 is an overall configuration diagram of a rechargeable battery parameter estimation apparatus according to a first embodiment of the present invention.

A description is now given of a rechargeable battery parameter estimation apparatus and a rechargeable battery parameter estimation method according to preferred embodiments of the present invention referring to the accompanying drawings. It should be noted that throughout the drawings, like or corresponding components are denoted by like reference numerals to describe those components.

First Embodiment

FIG. 1 is an overall configuration diagram of a rechargeable battery parameter estimation apparatus 101 according to a first embodiment of the present invention. A current measurement part 102 measures a current 104 flowing through a rechargeable battery 103. Moreover, a voltage measurement part 105 measures a voltage 106 between terminals of a positive electrode and a negative electrode of the battery 103. On this occasion, the measurements of the current 104 measured by the current measurement part 102 has an offset error 116.

A SoC estimation part 107 estimates an estimated value of the SoC 108 of the battery 103 in a manner that depends on a typical full charge capacity (FCC) of the battery 103 measured in advance and the voltage 106 measured by the voltage measurement part 105 on the basis of an equivalent circuit of the battery 103. It should be noted that, as illustrated in FIG. 1, the SoC estimation part 107 may further refer to the current 104 measured by the current measurement part 102. On this occasion, the typical FCC of the battery 103 has a capacity error 117, which is a difference of the typical FCC of the battery 103 measured in advance from an actual FCC of the battery 103 at a time when the battery 103 is in use.

A first coefficient calculation part 109 calculates, while referring to the internal calculations of the SoC estimation part 107, a first coefficient 110, which is a partial derivative of the estimated value of the SoC 108 with respect to the offset error 116 of the current 104 measured by the current measurement part 102, on the basis of the equivalent circuit of the battery 103.

A second coefficient calculation part 111 calculates, while referring to the internal calculations of the SoC estimation part 107, a second coefficient 112, which is a partial derivative of the estimated value of the SoC 108 with respect to the capacity error 117 of the FCC of the battery 103 measured in advance, on the basis of the equivalent circuit of the battery 103.

A current integration part 113 integrates the current 104 measured by the current measurement part 102, thereby calculating a current integration value 114.

An error estimation part 115 estimates the offset error 116 and the capacity error 117, from the first coefficient 110 calculated by the first coefficient calculation part 109, the second coefficient 112 calculated by the second coefficient calculation part 111, the current integration value 114 calculated by the current integration part 113, and the estimated value of the SoC 108 estimated by the SoC estimation part 107, then outputs the offset error 116 and the capacity error 117.

Figure 2:
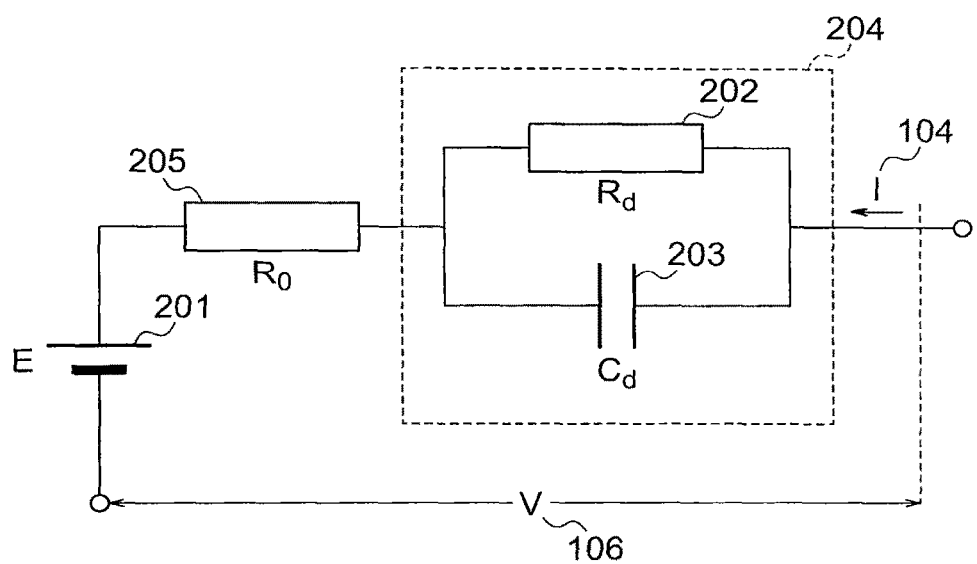
FIG. 2 illustrates an equivalent circuit of a rechargeable battery according to the first embodiment of the present invention.

FIG. 2 illustrates the equivalent circuit of the battery 103 according to the first embodiment of the present invention. A voltage source 201 having a voltage E [V] illustrated in FIG. 2 represents an open circuit voltage (OCV) of the battery 103. The OCV is a function of the SoC, and is defined for each battery 103. A parallel circuit 204 constructed by an electrical resistor 202 having a resistance $R_d$ [Ω] and a capacitor 203 having a capacitance $C_d$ [F] represents a relaxation process of the battery 103. An electrical resistor 205 having a resistance $R_0$ [Ω] represents a battery internal resistance other than the relaxation process.

On this occasion, let $q_b$ [C] denote an electrical quantity, which is an amount of electricity accumulated in the battery 103, $F_{cc}$ [C] denote the typical FCC of the battery 103, and s [%] denote the SoC of the battery 103, the electrical quantity $q_b$ [C] is expressed by:

$$q_b = F_{cc} s \quad (1)$$

Because of the Kirchhoff's current law relating to the equivalent circuit and the Ohm's law relating to the electrical resistances, the voltage 106 of the battery 103 denoted by V [V] is determined by the following differential equation system:

$$\dot{x} = F_c x + G_c I, \quad V = h(x) + R_0 I, \quad (2)$$

where $$F_c := \begin{bmatrix} -\frac{1}{C_d R_d} & \\ & 0 \end{bmatrix}, \quad G_c := \begin{bmatrix} 1 \\ 1 \end{bmatrix}. \quad (3)$$

Moreover, h(x) and x are defined by:

$$h(x) := E(q_b/F_{cc}) + \frac{1}{C_d} q_d, \quad x := [\, q_d \ \ q_b \,]^T. \quad (4)$$

Moreover, I denotes the current 104 flowing through the battery 103, and $C_d$, $R_d$, and $R_0$ are assumed as characteristic parameters of the equivalent circuit of the battery 103 illustrated in FIG. 2.

Let $t_s$ [second] be a sampling period of the current measurement part 102 and the voltage measurement part 105, the differential equation system (2) is discretized to the following difference equation system:

$$x_{k+1} = F x_k + G I_k, \quad V_k = h(x_k) + R_0 I_k, \quad (5)$$

where $$t_k := t_{S_k}, \quad (6)$$
$$x_k := x(t_k),$$
$$I_k := I(t_k),$$
$$V_k := V(t_k), \text{ and}$$

$$F := \begin{bmatrix} e^{-\frac{t_s}{R_d C_d}} & \\ & 1 \end{bmatrix}, \quad G := \begin{bmatrix} R_d C_d (1 - e^{-\frac{t_s}{C_d R_d}}) \\ t_s \end{bmatrix}. \quad (7)$$

Figure 3:
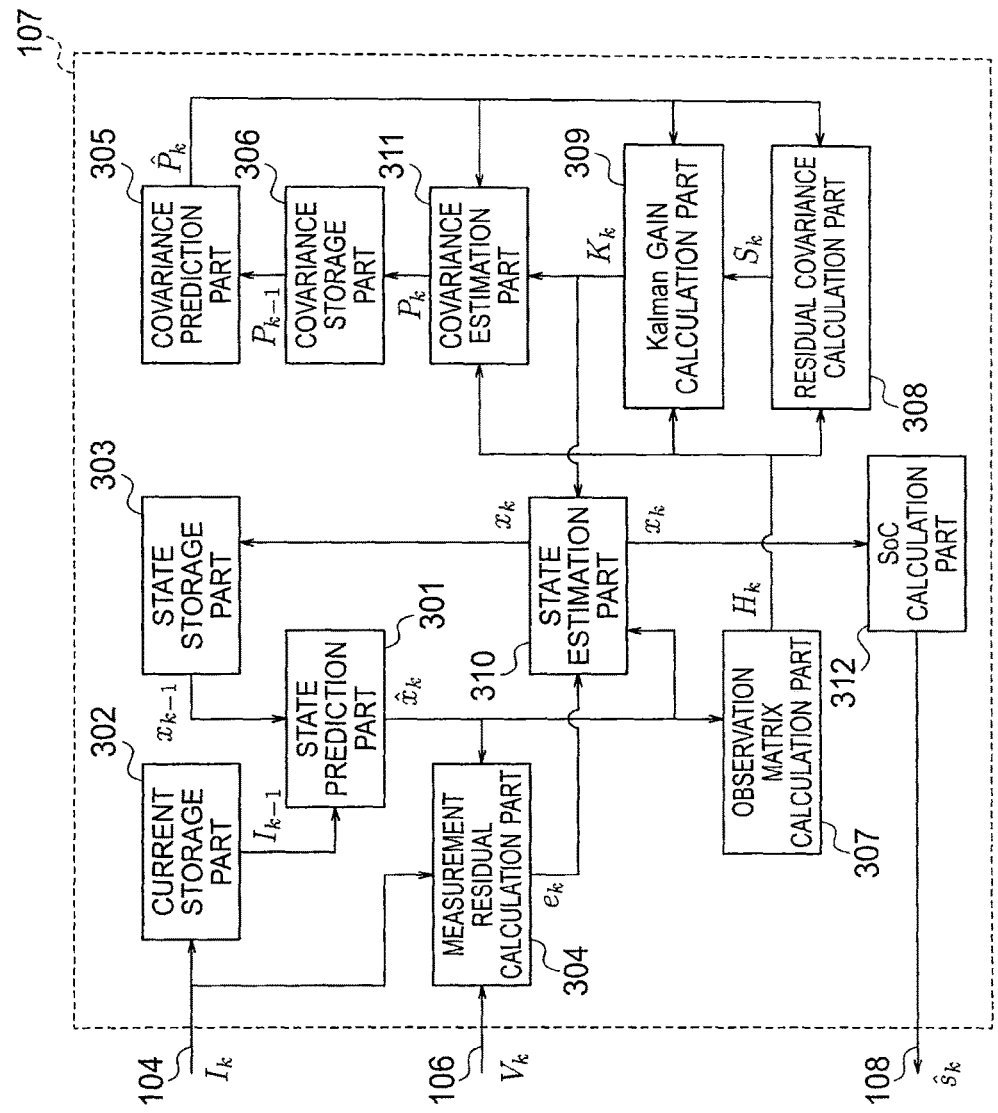
FIG. 3 is an overall configuration diagram of an SoC estimation part according to the first embodiment of the present invention.

FIG. 3 is an overall configuration diagram of the SoC estimation part 107 according to the first embodiment of the present invention. In the SoC estimation part 107 according to the first embodiment, an extended Kalman filter is used to estimate the estimated value of the SoC 108 of the battery 103 on the basis of the equivalent circuit illustrated in FIG. 2, namely, the difference equation system (5).

The SoC estimation part 107 periodically operates for each of the measurements carried out by the current measurement part 102 and the voltage measurement part 105. In the operation for a certain cycle, a state prediction part 301 calculates a predicted state estimate $\hat{x}^{-}_k$ from a current denoted by $I_{k-1}$, which is the current 104 of the battery 103 measured by the current measurement part 102 and stored in the current storage part 302 one cycle before, and an updated state estimate $x_{k-1}$, which is calculated by a state estimation part 310 and stored in a state storage part 303 one cycle before, by following:

$$\hat{x}_k = F x_{k-1} + G I_{k-1}. \quad (8)$$

A measurement residual calculation part 304 calculates a measurement residual $e_k$ from the predicted state estimate $\hat{x}^{-}_k$ calculated by the state prediction part 301, a current denoted by $I_k$, which is the current 104 of the battery 103 measured by the current measurement part 102 in a cycle, and a voltage denoted by $V_k$, which is the voltage 106 of the battery 103 measured by the voltage measurement part 105 by following:

$$e_k := V_k - h(\hat{x}_k) - R_0 I_k. \quad (9)$$

A covariance prediction part 305 calculates a predicted estimate covariance $\hat{P}^{-}_k$ from an updated estimate covariance $P_{k-1}$ calculated by a covariance estimation part 311 and stored in a covariance storage part 306 one cycle before by following:

$$\hat{P}_k = F P_{k-1} F^T + Q. \quad (10)$$

It should be noted that Q is calculated in advance by:

$$Q := \Phi_{12} \Phi_{22}^{-1}, \quad (11)$$

where $\Phi_{12}$ and $\Phi_{22}$ are matrices defined by:

$$\begin{bmatrix} \Phi_{11} & \Phi_{12} \\ \Phi_{21} & \Phi_{22} \end{bmatrix} := \exp\left( \begin{bmatrix} F_c & \sigma_I^2 G_c G_c^T \\ 0 & -F_c^T \end{bmatrix} t_s \right). \quad (12)$$

Moreover, $\sigma_I^2$ is a predetermined positive real constant representing a variance of an observation error of the current 104.

An observation matrix calculation part 307 calculates an observation matrix $H_k$ from the predicted state estimate $\hat{x}^{-}_k$ calculated by the state prediction part 301 by following:

$$H_k := \frac{\partial h(\hat{x}_k)}{\partial x}. \quad (13)$$

An residual covariance calculation part 308 calculates an residual covariance $S_k$ from the observation matrix $H_k$ calculated by the observation matrix calculation part 307 and the predicted estimate covariance $\hat{P}^{-}_k$ calculated by the covariance prediction part 305 by following:

$$S_k = \sigma_V^2 + H_k \hat{P}_k H_k^T. \quad (14)$$

where $\sigma_V^2$ is a predetermined positive real constant representing a variance of an observation error of the voltage 106.

A Kalman gain calculation part 309 calculates an optimal Kalman gain $K_k$ from the predicted estimate covariance $\hat{P}^{-}_k$ calculated by the covariance prediction part 305, the observation matrix $H_k$ calculated by the observation matrix calculation part 307, and the residual covariance $S_k$ calculated by the residual covariance calculation part 308 by following:

$$K_k = \hat{P}_k H_k^T S_k^{-1}. \quad (15)$$

The state estimation part 310 calculates an updated state estimate $x_k$ from the predicted state estimate $\hat{x}^{-}_k$ calculated by the state prediction part 301, the optimal Kalman gain $K_k$ calculated by the Kalman gain calculation part 309, and the measurement residual $e_k$ calculated by the measurement residual calculation part 304 by following:

$$x_k = \hat{x}_k + K_k e_k, \quad (16)$$

and stores a result in the state storage part 303.

The covariance estimation part 311 calculates an updated estimate covariance $P_k$ from the optimal Kalman gain $K_k$ calculated by the Kalman gain calculation part 309, the observation matrix $H_k$ calculated by the observation matrix calculation part 307, and the predicted estimate covariance $\hat{P}^{-}_k$ calculated by the covariance prediction part 305 by following:

$$P_k = \hat{P}_k - K_k H_k \hat{P}_k, \quad (17)$$

and stores the updated estimate covariance $P_k$ in the covariance storage part 306.

An SoC calculation part 312 calculates an estimated value of the SoC 108 by dividing an amount of charge $q_{b,k}$, which is the second element of the updated state estimate $x_k$ calculated by the state estimation part 310 by the typical FCC $F_{cc}$ of the battery 103 measured in advance.

The SoC estimation part 107 refers to the measured value of the current 104 in order to estimate the SoC 108. If the measured value of the current 104 is strictly equal to the current actually flowing through the battery 103, and the characteristics of the battery 103 strictly matches the equivalent circuit illustrated in FIG. 2, the SoC estimation part 107 provides the best SoC estimation in terms of the mean square error.

However, if the measured value of the current 104 has an offset error of a value ΔI [A], the estimated value of the SoC 108 has a bias error caused by the offset error of the current measurements. The first coefficient calculation part 109 of the first embodiment approximately quantifies the bias error of the estimated value of the SoC 108 caused by the offset error of the current measurements.

Figure 4:
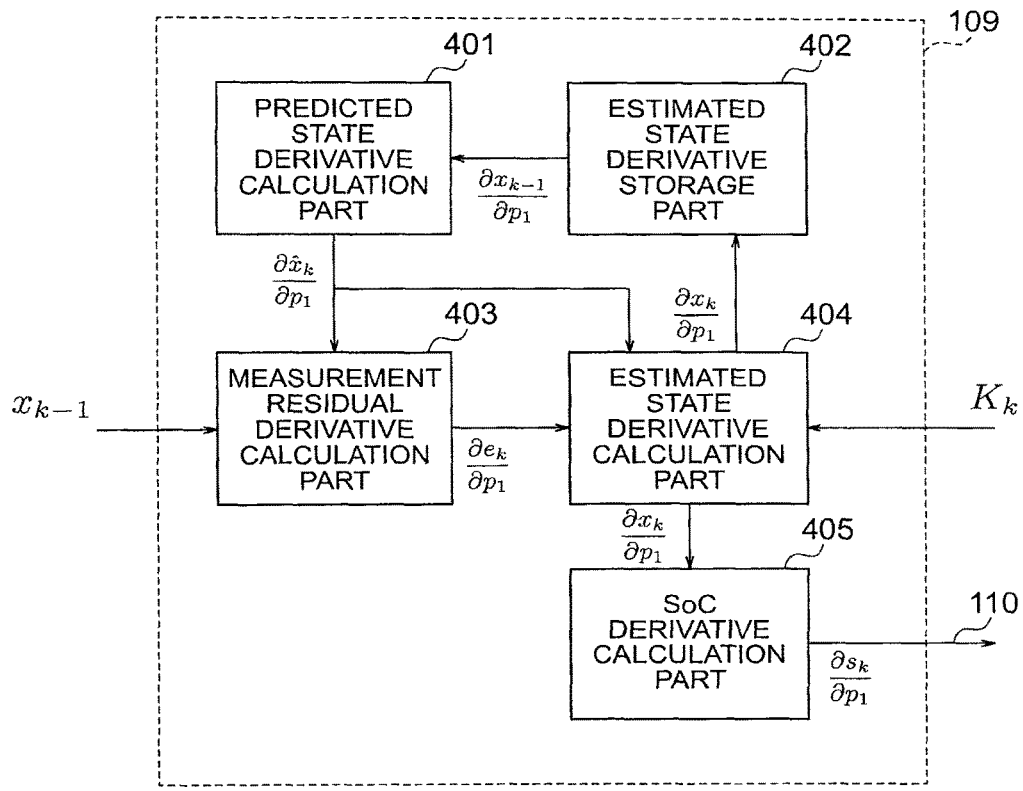
FIG. 4 is an overall configuration diagram of a first coefficient calculation part according to the first embodiment of the present invention.

FIG. 4 is an overall configuration diagram of the first coefficient calculation part 109 according to the first embodiment of the present invention. A predicted state derivative calculation part 401 calculates a partial derivative of the predicted state estimate with respect to a parameter $p_1$ denoted by $d\hat{x}^{-}_k/dp_1$ from a partial derivative of the updated state estimate with respect to the parameter $p_1$, which is denoted by $dx_{k-1}/dp_1$, calculated by an estimated state derivative calculation part 404 and stored in an estimated state derivative storage part 402 one cycle before by following:

$$\frac{\partial \hat{x}_k}{\partial p_1} = F \frac{\partial x_{k-1}}{\partial p_1} + GI_{typ}. \tag{18}$$

On this occasion, the offset error $\Delta I$ is expressed by $\Delta I = I_{typ} \times p_1$, where $I_{typ}$ is a constant introduced to ensure the absolute value of the parameter $p_1$ sufficiently smaller than 1.

An measurement residual derivative calculation part 403 calculates a partial derivative of the measurement residual with respect to the parameter $p_1$ denoted by $de_k/dp_1$ from the partial derivative of the predicted state estimate with respect to the parameter $p_1$ calculated by the predicted state derivative calculation part 401 by following:

$$\frac{\partial e_k}{\partial p_1} = -H_k \frac{\partial \hat{x}_k}{\partial p_1} - R_0 I_{typ}. \tag{19}$$

It should be noted that the observation matrix $H_k$ is calculated from the predicted state estimate $\hat{x}_k$, which is calculated by the state prediction part 301 by Equation (13).

The estimated state derivative calculation part 404 calculates a partial derivative of the updated state estimate with respect to the parameter $p_1$ denoted by $dx_k/dp_1$ from the partial derivative of the predicted state estimate with respect to the parameter p1, which is denoted by $d\hat{x}_k/dp_1$ and calculated by the predicted state derivative calculation part 401, the optimal Kalman gain $K_k$ calculated by the Kalman gain calculation part 309, and the partial derivative of the measurement residual with respect to the parameter $p_1$, which is denoted by $de_k/dp_1$ and calculated by the measurement residual derivative calculation part 403 by following:

$$\frac{\partial x_k}{\partial p_1} = \frac{\partial \hat{x}_k}{\partial p_1} + K_k \frac{\partial e_k}{\partial p_1}. \tag{20}$$

An SoC derivative calculation part 405 calculates the first coefficient 110 by dividing a second element of the partial derivative of the updated state estimate with respect to the parameter $p_1$, which is denoted by $dq_{b,k}/dp_1$ and calculated by the estimated state derivative calculation part 404 by the typical FCC $F_{cc}$ of the battery 103 measured in advance.

The SoC estimation part 107 uses the typical FCC $F_{cc}$ of the battery 103 in order to calculate the estimated value of the SoC 108. If the typical FCC $F_{cc}$ used by the SoC estimation part 107 matches the actual FCC of the battery 103, and the measurements of the current do not have an offset error, and other characteristics of the battery 103 match the equivalent circuit illustrated in FIG. 2, the SoC estimation part 107 illustrated in FIG. 3 provides the best SoC estimation in terms of the mean square error.

However, if the typical FCC $F_{cc}$ used by the SoC estimation part 107 has a capacity error, the estimated value of the SoC 108 has a bias error. The second coefficient calculation part 111 approximately quantifies the bias error in the estimated value of the SoC 108 caused by the capacity error of the typical FCC $F_{cc}$.

Figure 5:
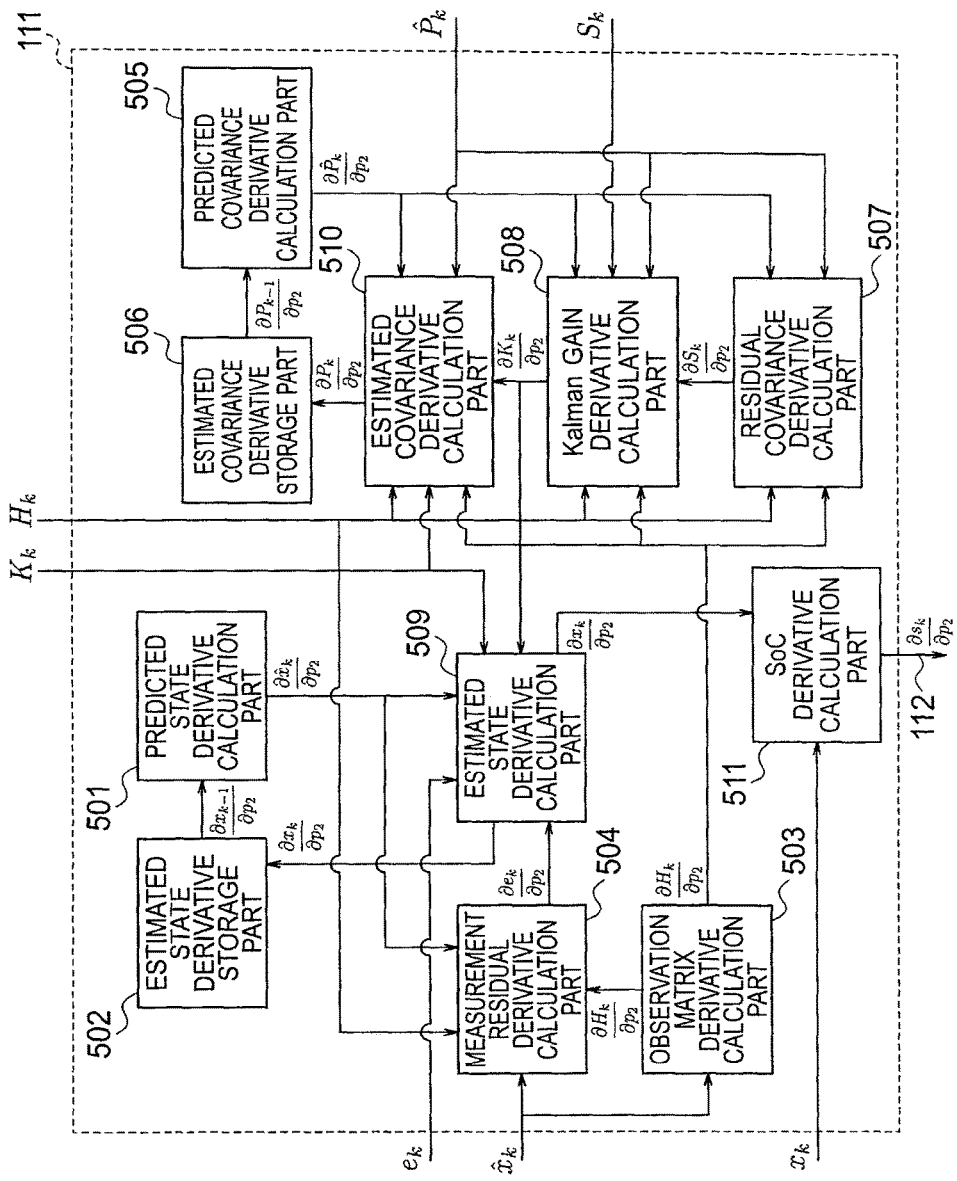
FIG. 5 is an overall configuration diagram of a second coefficient calculation part according to the first embodiment of the present invention.

FIG. 5 is an overall configuration diagram of the second coefficient calculation part 111 according to the first embodiment of the present invention. In the following, the actual FCC of the battery 103 is denoted by $F_{cc}$, and the typical FCC used by the SoC estimation part 107 is denoted by $\tilde{F}_{cc}$. On this occasion, it is assumed that $\tilde{F}_{cc}$ is differ from $F_{cc}$ as:

$$\tilde{F}_{cc} = F_{cc}(1 + p_2). \tag{21}$$

On this occasion, it is assumed that the difference is sufficiently smaller than $F_{cc}$, in other words, the absolute value of the parameter $p_2$ is sufficiently smaller than 1.

A predicted state derivative calculation part 501 calculates a partial derivative of the predicted state estimate with respect to a parameter $p_2$, which is denoted by $d\hat{x}_k/dp_2$, from a partial derivative of the updated state estimate with respect to the parameter $p_2$, which is denoted by $dx_{k-1}/dp_2$, calculated by an estimated state derivative calculation part 509 and stored in an estimated state derivative storage part 502 one cycle before by following:

$$\frac{\partial \hat{x}_k}{\partial p_2} = F \frac{\partial x_{k-1}}{\partial p_2}. \tag{22}$$

An observation matrix derivative calculation part 503 calculates a partial derivative of the observation matrix with respect to the parameter $p_2$, which is denoted by $dH_k/dp_2$, from the predicted state estimate $\hat{x}_k$ calculated by the state prediction part 301.

An measurement residual derivative calculation part 504 calculates a partial derivative of the measurement residual with respect to the parameter $p_2$, which is denoted by $de_k/dp_2$, from the partial derivative of the observation matrix with respect to the parameter $p_2$, which is denoted by $dH_k/dp_2$ and calculated by the observation matrix derivative calculation part 503, the predicted state estimate $\hat{x}_k$ calculated by the state prediction part 301, the observation matrix $H_k$ calculated by the observation matrix calculation part 307, and the partial derivative of the predicted state estimate with respect to the parameter $p_2$, which is denoted by $d\hat{x}_k/dp_2$ and calculated by the predicted state derivative calculation part 501 by following:

$$\frac{\partial e_k}{\partial p_2} = -\frac{\partial H_k}{\partial p_2} \hat{x}_k - H_k \frac{\partial \hat{x}_k}{\partial p_2}. \tag{23}$$

A predicted covariance derivative calculation part 505 calculates a partial derivative of the predicted estimate covariance with respect to the parameter $p_2$, which is denoted by $d\hat{P}_k/dp_2$, from a partial derivative of the updated estimate covariance with respect to the parameter $p_2$, which is denoted by $dP_{k-1}/dp_2$, calculated by a estimated covariance derivative calculation part 510 and stored in an estimated covariance derivative storage part 506 one cycle before by following:

$$\frac{\partial \hat{P}_k}{\partial p_2} = F \frac{\partial P_{k-1}}{\partial p_2} F^T. \tag{24}$$

An residual covariance derivative calculation part 507 calculates a partial derivative of the residual covariance with respect to the parameter $p_2$, which is denoted by $dS_k/dp_2$, from the partial derivative of the observation matrix with respect to the parameter $p_2$, which is denoted by $dH_k/dp_2$ and calculated by the observation matrix derivative calculation part 503, the predicted estimate covariance $\hat{P}_k$ calculated by the covariance prediction part 305, the observation matrix $H_k$ calculated by the observation matrix calculation part 307, and the partial derivative of the predicted estimate covariance with respect to the parameter $p_2$, which is denoted by $d\hat{P}_k/dp_2$ and calculated by the predicted covariance derivative calculation part 505 by following:

$$\frac{\partial S_k}{\partial p_2} = \frac{\partial H_k}{\partial p_2}\hat{P}_k H_k^T + H_k \frac{\partial \hat{P}_k}{\partial p_2} H_k^T + H_k \hat{P}_k \frac{\partial H_k^T}{\partial p_2}. \quad (25)$$

A Kalman gain derivative calculation part 508 calculates a partial derivative of the Kalman gain with respect to the parameter $p_2$, which is denoted by $dK_k/dp_2$, from the partial derivative of the predicted estimate covariance with respect to the parameter $p_2$, which is denoted by $d\hat{P}_k/dp_2$ and calculated by the predicted covariance derivative calculation part 505, the partial derivative of the observation matrix with respect to the parameter $p_2$, which is denoted by $dH_k/dp_2$ and calculated by the observation matrix derivative calculation part 503, the residual covariance $S_k$ calculated by the residual covariance calculation part 308, the predicted estimate covariance $\hat{P}_k$ calculated by the covariance prediction part 305, the partial derivative of the observation matrix with respect to the parameter $p_2$, which is denoted by $dH_k/dp_2$ and calculated by the observation matrix derivative calculation part 503, and the partial derivative of the residual covariance with respect to the parameter $p_2$, which is denoted by $dS_k/dp_2$ and calculated by the residual covariance derivative calculation part 507 by following:

$$\frac{\partial K_k}{\partial p_2} = \frac{\partial \hat{P}_k}{\partial p_2}H_k^T S_k^{-1} + \hat{P}_k \frac{\partial H_k^T}{\partial p_2} S_k^{-1} - \hat{P}_k H_k^T S_k^{-1}\frac{\partial S_k}{\partial p_2}S_k^{-1}. \quad (26)$$

The estimated state derivative calculation part 509 calculates a partial derivative of the updated state estimate with respect to the parameter $p_2$, which is denoted by $dx_k/dp_2$, from the partial derivative of the updated state estimate with respect to the parameter $p_2$, which is denoted by $d\hat{x}_k/dp_2$ and calculated by the predicted state derivative calculation part 501, the partial derivative of the optimal Kalman gain with respect to the parameter $p_2$, which is denoted by $dK_k/dp_2$ and calculated by the Kalman gain derivative calculation part 508, the measurement residual $e_k$ calculated by the measurement residual calculation part 304, the optimal Kalman gain $K_k$ calculated by the Kalman gain calculation part 309, and the partial derivative of the measurement residual with respect to the parameter $p_2$, which is denoted by $de_k/dp_2$ and calculated by the measurement residual derivative calculation part 504 by following:

$$\frac{\partial x_k}{\partial p_2} = \frac{\partial \hat{x}_k}{\partial p_2} + \frac{\partial K_k}{\partial p_2}e_k + K_k \frac{\partial e_k}{\partial p_2}, \quad (27)$$

and stores the resulting partial derivative of the updated state estimate with respect to the parameter $p_2$, which is denoted by $dx_k/dp_2$, in the estimated state derivative storage part 502.

The estimated covariance derivative calculation part 510 calculates a partial derivative of the updated estimate covariance with respect to the parameter $p_2$, which is denoted by $dP_k/dp_2$, from the partial derivative of the predicted estimate covariance with respect to the parameter $p_2$, which is denoted by $d\hat{P}_k/dp_2$ and calculated by the predicted covariance derivative calculation part 505, the partial derivative of the optimal Kalman gain with respect to the parameter $p_2$, which is denoted by $dK_k/dp_2$ and calculated by the Kalman gain derivative calculation part 508, the observation matrix $H_k$ calculated by the observation matrix calculation part 307, the predicted estimate covariance $\hat{P}_k$ calculated by the covariance prediction part 305, the optimal Kalman gain $K_k$ calculated by the Kalman gain calculation part 309, and the partial derivative of the observation matrix with respect to the parameter $p_2$, which is denoted by $dH_k/dp_2$ and calculated by the observation matrix derivative calculation part 503 by following:

$$\frac{\partial P_k}{\partial p_2} = \frac{\partial \hat{P}_k}{\partial p_2} - \frac{\partial K_k}{\partial p_2}H\hat{P}_k + K_k\frac{\partial H_k}{\partial p_2}\hat{P}_k + K_k H_k \frac{\partial \hat{P}_k}{\partial p_2}, \quad (28)$$

and stores the resulting updated estimate covariance with respect to the parameter $p_2$, which is denoted by $dP_k/dp_2$, in the estimated covariance derivative storage part 506.

The SoC derivative calculation part 511 calculates a second coefficient, which is denoted by $ds_k/dp_2$, from the typical FCC of the battery 103 measured in advance, a partial derivative of the amount of charge, which is denoted by $dq_{b,k}/dp_2$, obtained as the second element of the partial derivative of the updated state estimate with respect to the parameter $p_2$ and calculated by the estimated state derivative calculation part 509, and the amount charge $q_{b,k}$, which is obtained as the second element of the estimated state $x_k$ estimated by the state estimation part 310 by following:

$$\frac{\partial s_k}{\partial p_2} = \frac{1}{F_{cc}}\left(\frac{\partial q_{b,k}}{\partial p_2} - q_{b,k}\right). \quad (29)$$

The current integration part 113 calculates an integration value of the current 104 from the initial time by following:

$$q_{cc,k} = q_{cc,k-1} + t_s I_{k-1}. \quad (30)$$

Incidentally, if the SoC of the battery 103 is correctly estimated, the measurements of the current do not have an offset error, and the typical FCC is equal to the actual FCC of the battery 103, the following equation holds:

$$q_{cc,k} = F_{cc}s_k - q_0, \quad (31)$$

where $q_0$ denotes an initial charged capacity.

However, actually, the measurements of the current have an offset error, the typical FCC differs from the actual FCC, and further, the estimated value of the SoC 108 has a bias error caused by the offset error of the current measurements and the capacity error of the FCC. Thus, Equation (31) is corrected as:

$$q_{cc,k} = \frac{\tilde{F}_{cc}}{1+p_2}\left(\tilde{s}_k - \frac{\partial s_k}{\partial p_1}p_1 - \frac{\partial s_k}{\partial p_2}p_2\right) + t_k I_{typ}p_1 - q_0. \quad (32)$$

By omitting the higher order terms with respect to the parameters $p_1$ and $p_2$, Equation (32) is transformed into:

$$q_{cc,k} - \tilde{F}_{cc}\tilde{s}_k = \left(t_k I_{typ} - \tilde{F}_{cc}\frac{\partial s_k}{\partial p_1}\right)p_1 - \tilde{F}_{cc}\left(\tilde{s}_k + \frac{\partial s_k}{\partial p_2}\right)p_2 - q_0. \quad (33)$$

On this occasion, the left hand side of Equation (33) is a constant at each cycle, and the right hand side of Equation (33) is a linear expression in terms of the parameters $p_1$, $p_2$, and the initial charged capacity $q_0$ at each cycle. Thus, the optimal estimation of the parameters in terms of the mean square error, which is denoted by $\hat{p}_k$, is obtained with a recursive least squares filter which minimizes the following objective function:

$$J(\hat{p}_k) := \sum_{l=0}^{k-1} \lambda^{k-1}(y_l - \hat{p}_k^T u_l)^2, \quad (34)$$

where $\lambda$ is a forgetting factor which is a predetermined real constant more than 0 and equal to or less than 1.

In the first embodiment, the vector $u_k$ referred to as an explanatory variable is defined by the estimated value of the SoC $s_k$, the first coefficient $ds_k/dp_1$, and the second coefficient $ds_k/dp_2$ as follows:

$$u_k := \begin{bmatrix} t_k I_{typ} - \tilde{F}_{cc}\frac{\partial s_k}{\partial p_1} \\ -\tilde{F}_{cc}\left(s_k + \frac{\partial s_k}{\partial p_2}\right) \\ -1 \end{bmatrix}. \quad (35)$$

Moreover, in the first embodiment, the scalar $y_k$ referred to as an observed variable is defined by:

$$y_k := q_{cc,k} \tilde{F}_{cc} s_k. \quad (36)$$

Moreover, in the first embodiment, the vector $\hat{p}_k$ referred to as an estimated parameter vector is composed of an estimated value of the parameter $p_1$ as the first element, an estimated value of the parameter $p_2$ as the second element, and an estimated value of the initial charge capacity $q_0$ as the third element. The gist of the present invention is to use this fact, to thereby estimate the parameters $p_1$ and $p_2$, by which the offset error and the capacity error of the battery are able to be corrected.

Figure 6:
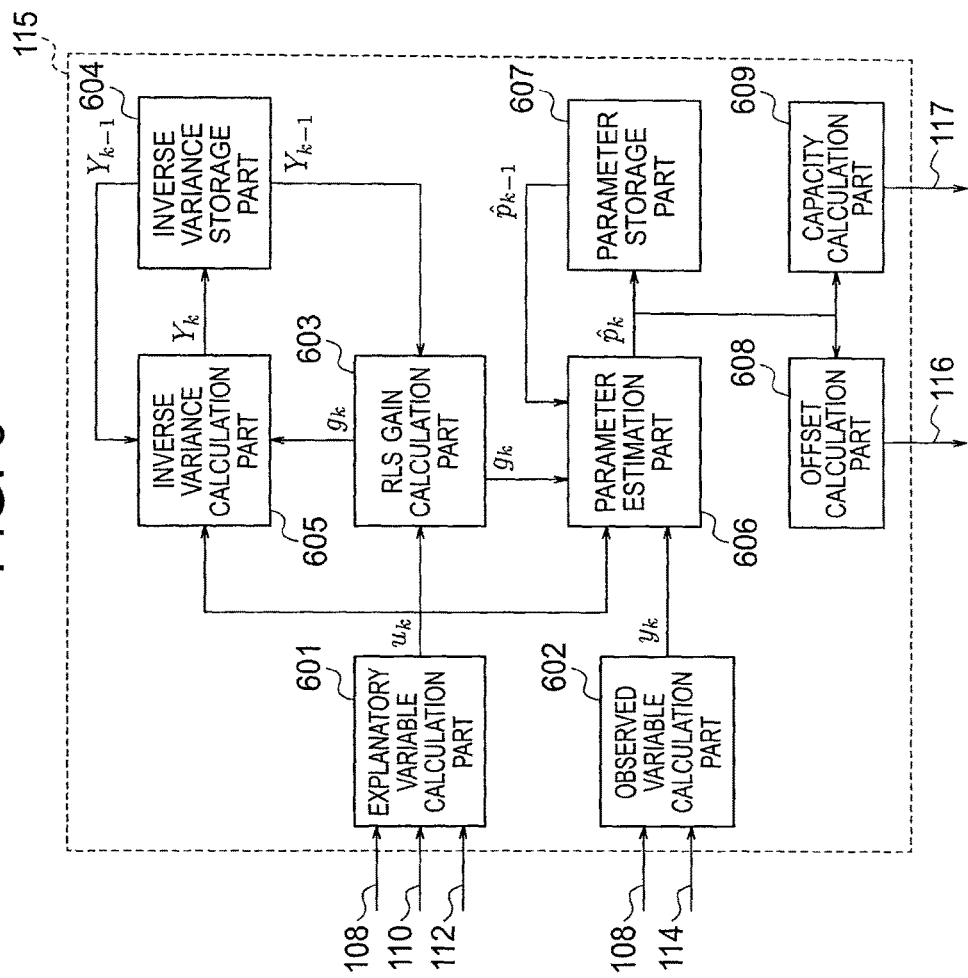
FIG. 6 is an overall configuration diagram of an error estimation part according to the first embodiment of the present invention.

FIG. 6 is an overall configuration diagram of the error estimation part 115 according to the first embodiment of the present invention. An explanatory variable calculation part 601 calculates the explanatory variable $u_k$ by Equation (35) from the estimated value of the SoC 108 estimated by the SoC estimation part 107, the first coefficient 110 calculated by the first coefficient calculation part 109, and the second coefficient 112 calculated by the second coefficient calculation part 111.

An observed variable calculation part 602 calculates the observed variable $y_k$ by Equation (36) from the estimated value of the SoC 108, and the current integration value 114 calculated by the current integration part 113.

An RLS gain calculation part 603 calculates an RLS gain $g_k$ from the explanatory variable $u_k$ calculated by the explanatory variable calculation part 601, and an inverse variance $Y_{k-1}$, which is calculated by an inverse variance calculation part 605 and stored in an inverse variance storage part 604 one cycle before by following:

$$g_k = Y_{k-1} u_k (\lambda + u_k^T Y_{k-1} u_k)^{-1}. \quad (37)$$

The inverse variance calculation part 605 calculates the inverse variance $Y_k$ from the inverse variance $Y_{k-1}$, which is calculated by the inverse variance calculation part 605 and stored in the inverse variance storage part 604 one cycle before, the RLS gain $g_k$ calculated by the RLS gain calculation part 603, and the explanatory variable $u_k$ calculated by the explanatory variable calculation part 601 by following:

$$Y_k = \lambda^{-1}(I_d - g_k u_k^T) Y_{k-1}, \quad (38)$$

where $I_d$ denotes a unit matrix.

A parameter estimation part 606 calculates the estimated parameter vector $\hat{p}_k$ from the explanatory variable $u_k$ calculated by the explanatory variable calculation part 601, the observed variable $y_k$ calculated by the observed variable calculation part 602, the RLS gain $g_k$ calculated by the RLS gain calculation part 603, and a estimated parameter vector $\hat{p}_{k-1}$ stored in a parameter storage part 607 one cycle before by following:

$$\hat{p}_k = \hat{p}_{k-1} + g_k(y_k - u_k^T \hat{p}_{k-1}), \quad (39)$$

then stores the estimated parameter vector $\hat{p}_k$ in the parameter storage part 607.

The offset error $\Delta I$ of the current measurements is obtained by $\Delta I = I_{typ} \times p_1$, where the parameter $p_1$ is the first element of the estimated parameter vector $\hat{p}_k$, and the actual FCC of the battery is obtained by $F_{cc} = \tilde{F}_{cc}(1-p_2)$, where $p_2$ is the second element of the estimated parameter vector $\hat{p}_k$.

An offset calculation part 608 and a capacity calculation part 609 carry out this calculation, and respectively estimate the offset error 116 of the current measurements and the capacity error 117 of the battery.

Figure 7:
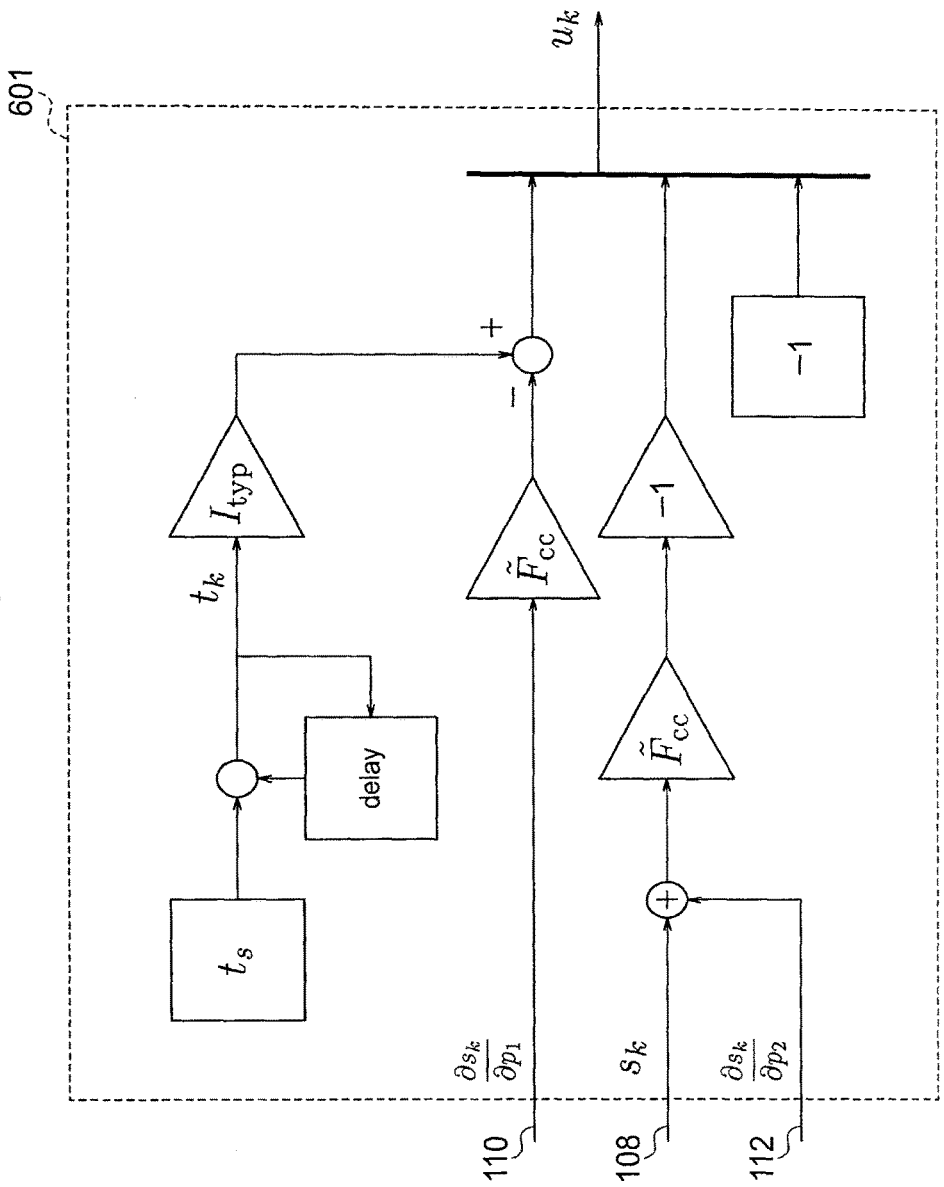
FIG. 7 is a block diagram of an explanatory variable calculation part according to the first embodiment of the present invention.

FIG. 7 is a block diagram of the explanatory variable calculation part 601 according to the first embodiment of the present invention. A time point $t_k$ is calculated by adding a sampling period $t_s$ to a time point $t_{k-1}$ for one cycle before.

The first element of the explanatory variable $u_k$ is calculating by acquiring a difference between a product of the time point $t_k$ and the constant $I_{typ}$ and a product of the first coefficient 110 calculated by the first coefficient calculation part 109 and the typical FCC $\tilde{F}_{cc}$. The second element of the explanatory variable $u_k$ is calculated by acquiring a sum by adding the second coefficient 112 calculated by the second coefficient calculation part 111 to the estimated value of the SoC 108 estimated by the SoC estimation part 107, acquiring a product by multiplying the sum by the typical FCC $\tilde{F}_{cc}$, and negating the product. The third element of the explanatory variable $u_k$ is set a constant of $-1$.

Figure 8:
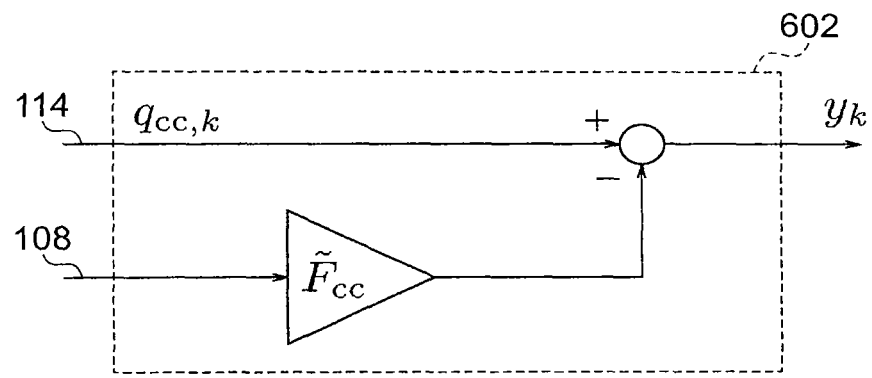
FIG. 8 is a block diagram of an observed variable calculation part according to the first embodiment of the present invention.

FIG. 8 is a block diagram of the observed variable calculation part 602 according to the first embodiment of the present invention. The observed variable $y_k$ is calculated by acquiring a difference between the current integration value 114 calculated by the current integration part 113 and a product acquired by multiplying the typical FCC $\tilde{F}_{cc}$ by the estimated value of the SoC $s_k$ estimated by the SoC estimation part 107.

Figure 9:
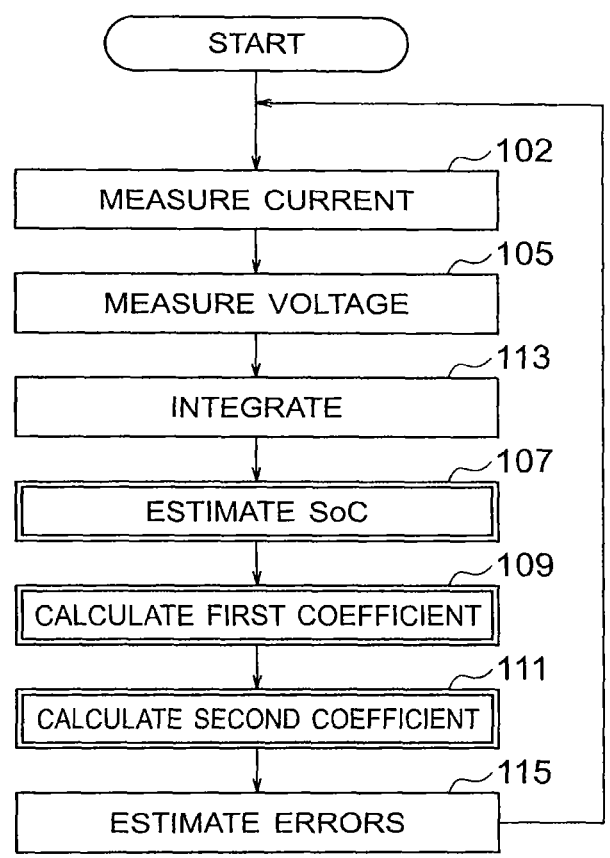
FIG. 9 is a flowchart of a rechargeable battery parameter estimation method according to the first embodiment of the present invention.

FIG. 9 is a flowchart of a rechargeable battery parameter estimation method according to the first embodiment of the present invention. Each step of the flowchart corresponds to a processing executed by the corresponding part of the rechargeable battery parameter estimation apparatus 101 illustrated in FIG. 1. It should be noted that an execution sequence of the rechargeable battery parameter estimation method according to the first embodiment is not limited to the execution sequence illustrated in FIG. 9. The execution sequence of the steps can be shuffled as long as the dependencies among the steps are not violated.

Figure 10:
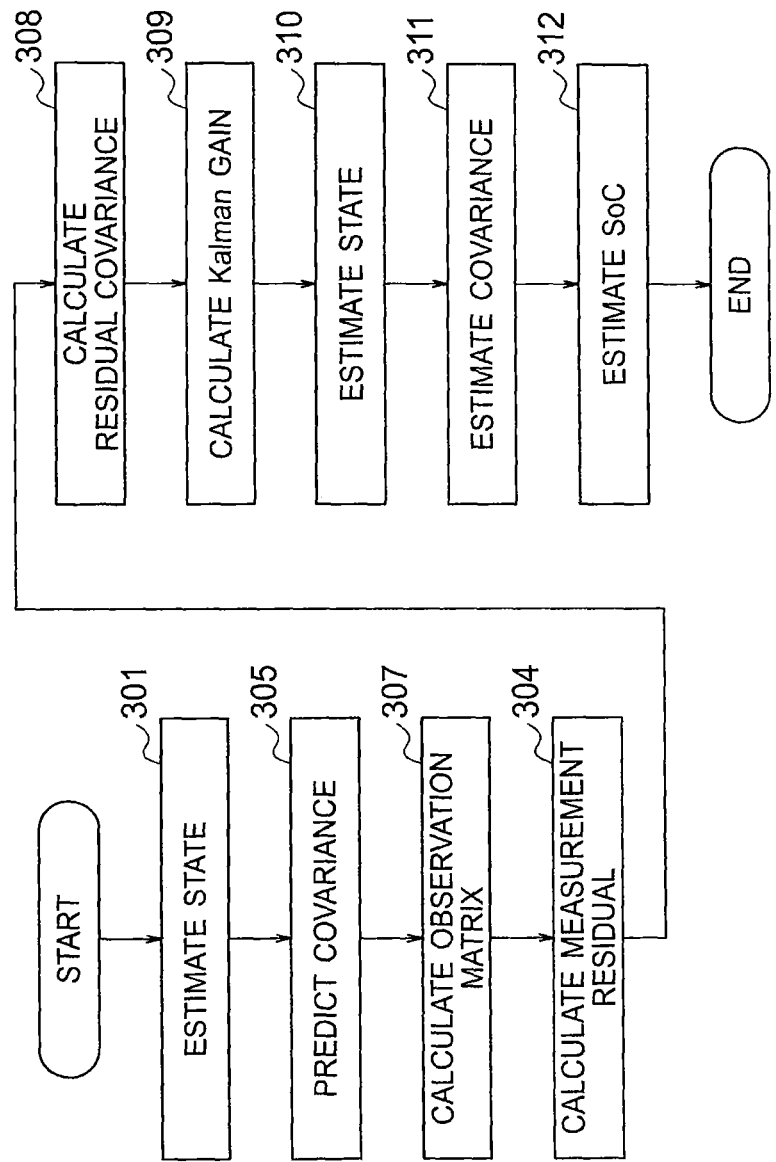
FIG. 10 is a flowchart of a processing executed by the SoC estimation part in a cycle of periodic operations according to the first embodiment of the present invention.

FIG. 10 is a flowchart of a processing executed by the SoC estimation part 107 in a cycle of periodic operations according to the first embodiment of the present invention. Each step of the flowchart corresponds to a processing executed by the corresponding part of the SoC estimation part 107 illustrated in FIG. 3. It should be noted that an execution sequence by the SoC estimation part 107 according to the first embodiment is not limited to the execution sequence illustrated in FIG. 10. The execution sequence of the steps can be shuffled as long as the dependencies among the steps are not violated.

Figure 11:
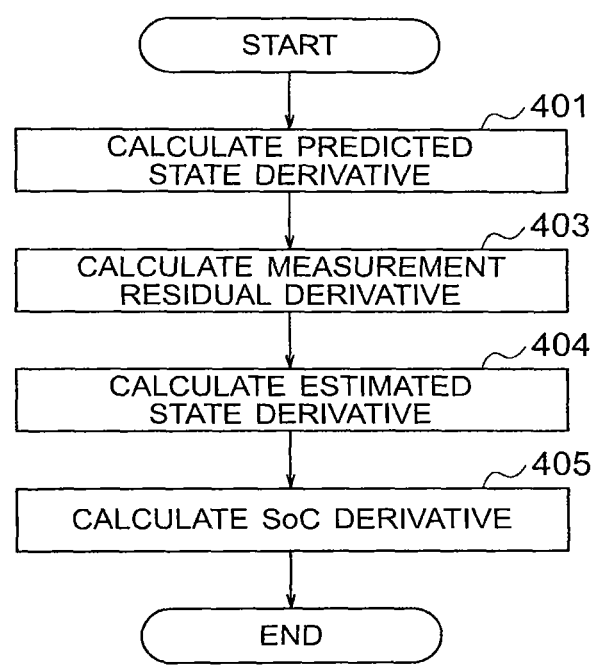
FIG. 11 is a flowchart of a processing executed by the first coefficient calculation part in a cycle of periodic operations according to the first embodiment of the present invention.

FIG. 11 is a flowchart of a processing executed by the first coefficient calculation part 109 in a cycle of periodic operations according to the first embodiment of the present invention. Each step of the flowchart corresponds to a processing executed by the corresponding part of the first coefficient calculation part 109 illustrated in FIG. 4. It should be noted that an execution sequence by the first coefficient calculation part 109 according to the first embodiment is not limited to the execution sequence illustrated in FIG. 11. The execution sequence of the steps can be shuffled as long as the dependencies among the steps are not violated.

Figure 12:
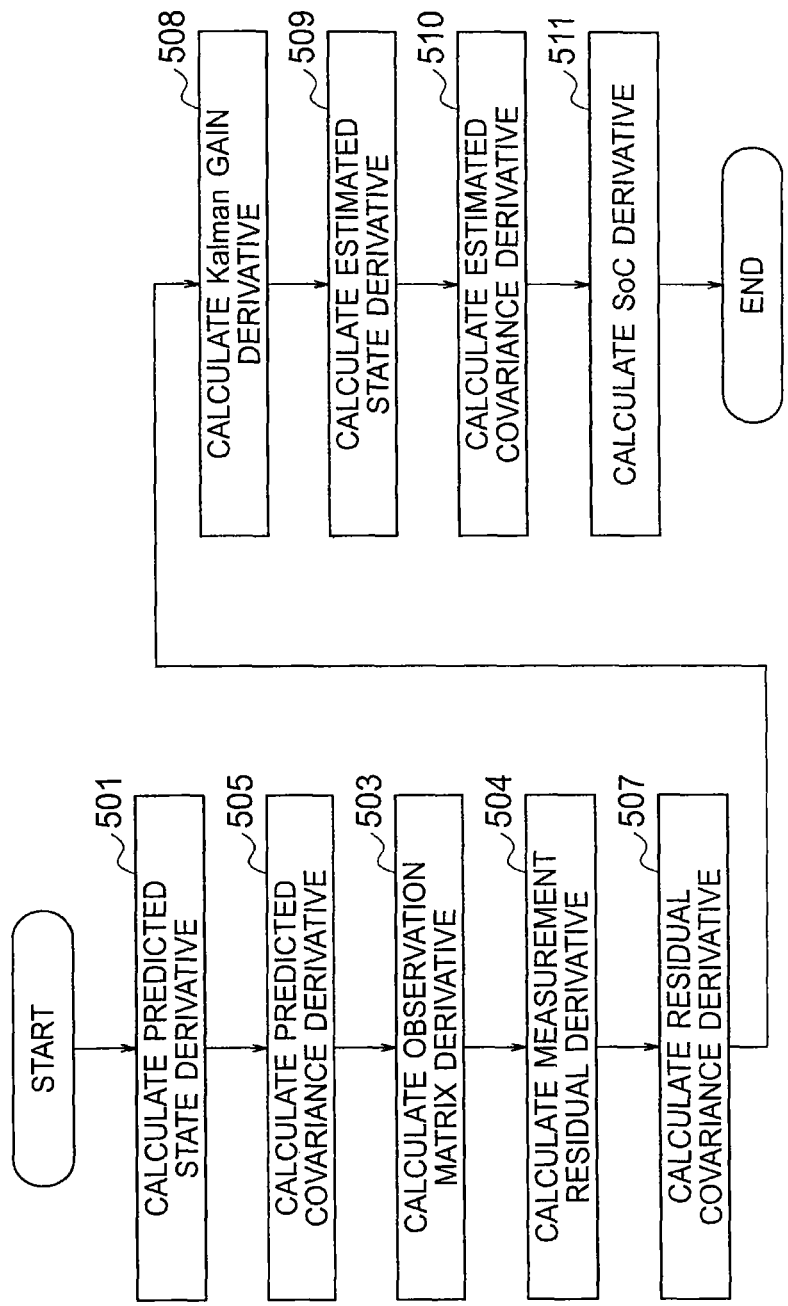
FIG. 12 is a flowchart of a processing executed by the second coefficient calculation part in a cycle of periodic operations according to the first embodiment of the present invention.

FIG. 12 is a flowchart of a processing executed by the second coefficient calculation part 111 in a cycle of periodic operations according to the first embodiment of the present invention. Each step of the flowchart corresponds to a processing executed by the corresponding part of the second coefficient calculation part 111 illustrated in FIG. 5. It should be noted that an execution sequence by the second coefficient calculation part 111 according to the first embodiment is not limited to the execution sequence illustrated in FIG. 12. The execution sequence of the steps can be shuffled as long as the dependencies among the steps are not violated.

Figure 13:
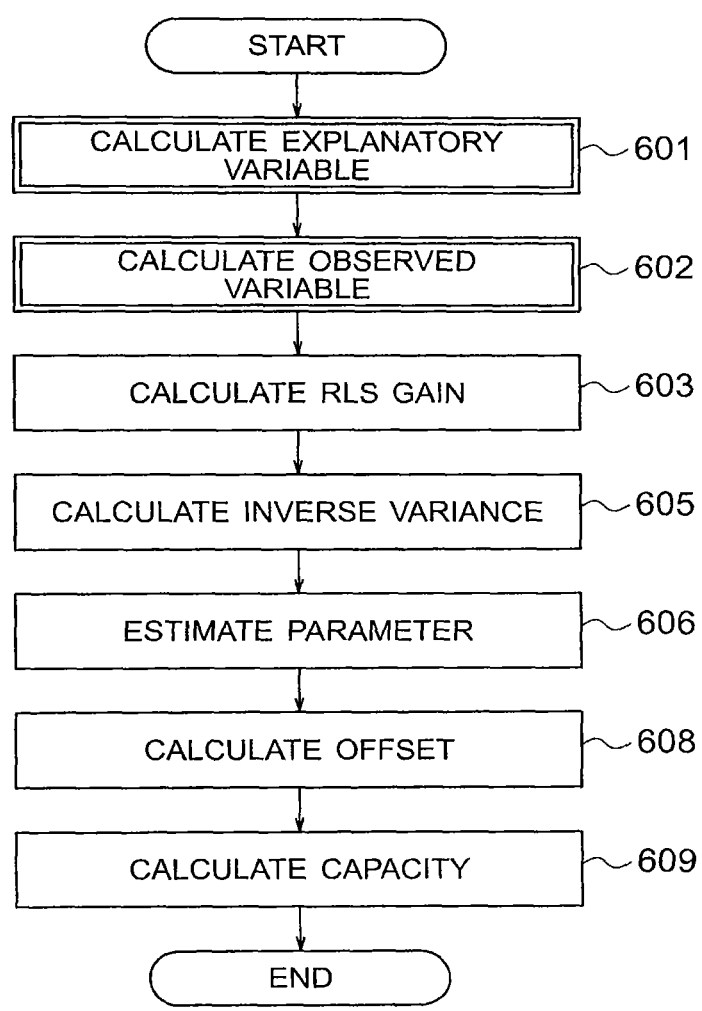
FIG. 13 is a flowchart of a processing executed by the error estimation part in a cycle of periodic operations according to the first embodiment of the present invention.

FIG. 13 is a flowchart of a processing executed by the error estimation part 115 in a cycle of periodic operations according to the first embodiment of the present invention. Each step of the flowchart corresponds to a processing executed by the corresponding part of the error estimation part 115 illustrated in FIG. 6. It should be noted that an execution sequence by the error estimation part 115 according to the first embodiment is not limited to the execution sequence illustrated in FIG. 13. The execution sequence of the steps can be shuffled as long as the dependencies among the steps are not violated.

Moreover, a detailed calculation method according to the first embodiment is not limited that described in the first embodiment. For example, Equation (38) is an equation for recursively calculating the inverse variance $Y_k$, which is an inverse of the weighted covariance matrix $R_k$ of the explanatory variable $u_k$, but the inverse variance $Y_k$ may be calculated by means of usual matrix inversion, which increases a calculation complexity, by following:

$$Y_k = \left( \sum_{l=0}^{k} \lambda^{k-l} u_k u_k^T \right)^{-1}. \tag{40}$$

Similarly, the estimated parameter vector $\hat{p}_k$ can be calculated from a vector $r_k$ defined by:

$$r_k := \sum_{l=0}^{k} \lambda^{k-l} y_k u_k, \tag{41}$$

as follows:

$$\hat{p}_k = Y_k r_k. \tag{42}$$

Alternatively, in the first embodiment, the forgetting factor $\lambda$ is assumed as a constant, but may be changed in a manner that depends on k.

Further, in the first embodiment, the SoC estimation part 107 uses a Kalman filter to obtain the estimated value of the SoC 108 from the current 104 flowing through the battery 103 and the voltage 106 between the terminals of the battery 103, but the SoC estimation part 107 according to the first embodiment is not limited to the implementation using the Kalman filter. As long as the partial derivatives of the estimated value of the SoC 108 with respect to the offset error of the current measurements and the capacity error of the FCC can be calculated, the present invention is applicable.

The rechargeable battery parameter estimation apparatus 101 according to the first embodiment may be realized, for example, as a microcontroller with a memory and an input/output function. In this case, each part other than the current measurement part 102 and the voltage measurement part 105 is realized as software embedded in the microcontroller.

As described above, according to the first embodiment, assuming either one or both of current measurements of a rechargeable battery and the typical FCC of the battery measured in advance have errors, the errors are estimated from an estimated value of the SoC, which is estimated from measurements of a voltage between terminals of the battery on the basis of an equivalent circuit of the battery. As a result, it is possible to provide a rechargeable battery parameter estimation apparatus capable of highly precisely estimating the offset error of the current measurements and the capacity error of the FCC, even if the measurements of the current have an offset error.

As a result, more efficient energy management can be provided, which contributes to energy saving. Moreover, the highly precise estimation of rechargeable battery parameters enables a continuous degradation assessment of rechargeable batteries, which contributes lifetime management of rechargeable batteries, a reduction in a maintenance cost of a electrical power storage system, and the like.

Second Embodiment

Figure 14:
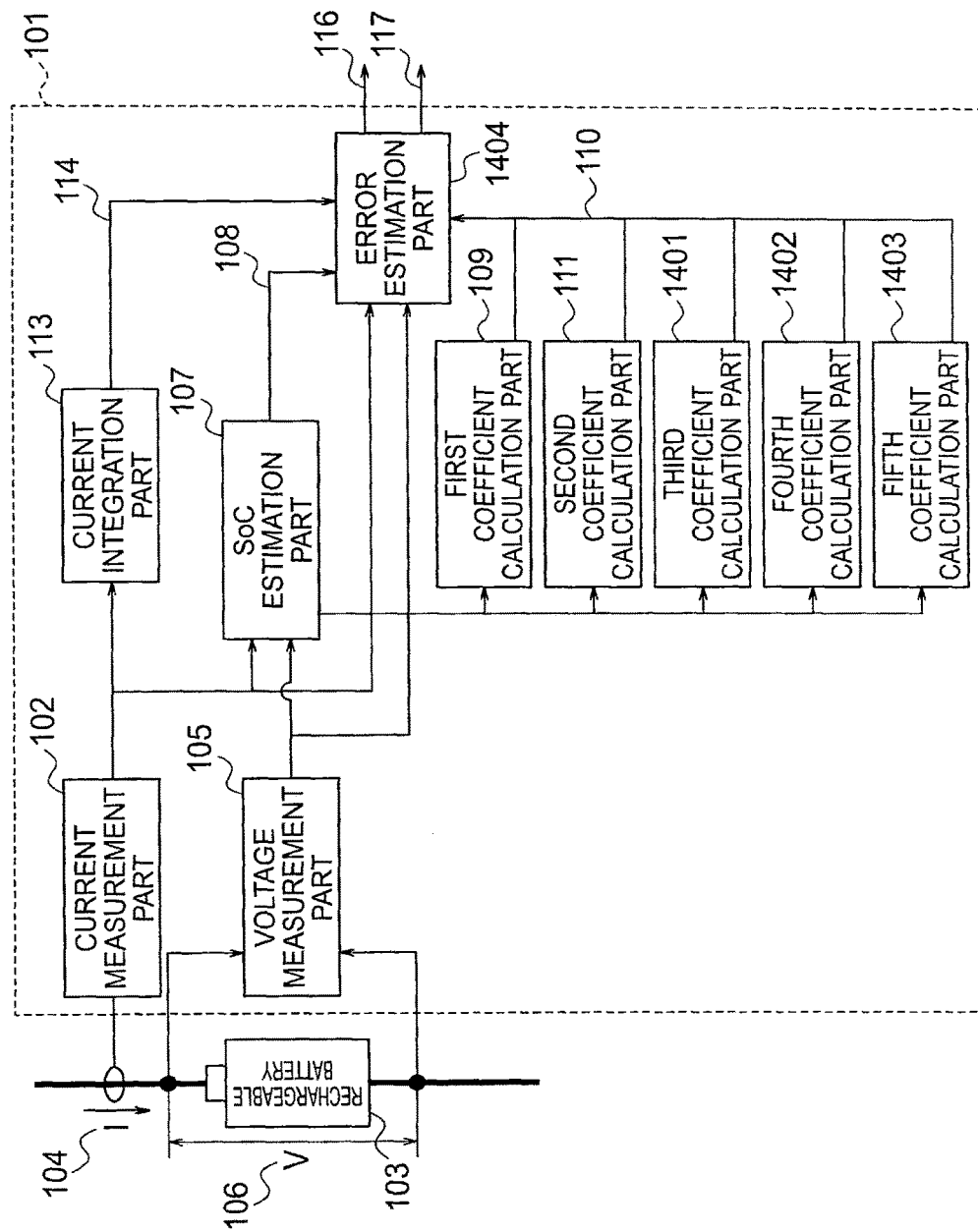
FIG. 14 is an overall configuration diagram of a rechargeable battery parameter estimation apparatus according to a second embodiment of the present invention.

FIG. 14 is an overall configuration diagram of a rechargeable battery parameter estimation apparatus 101 according to a second embodiment of the present invention. The rechargeable battery parameter estimation apparatus 101 according to the second embodiment illustrated in FIG. 14 is different from that illustrated in FIG. 1 of the first embodiment in such a point that the offset error 116 of the current measurements and the capacity error 117 of the FCC are estimated while errors in the characteristic parameters $R_d$, $C_d$, and $R_0$ of the equivalent circuit of the battery 103 illustrated in FIG. 2 are additionally considered.

Specifically, typical parameters $R_d$, $C_d$, and $R_0$ measured in advance for the use in the SoC estimation part 107 are considered to have errors compared with those of the actual battery at the battery in use, and are parameterized as:

$$\tilde{R}_d \tilde{C}_d = R_d C_d (1 + p_3), \tag{43}$$

$$\frac{1}{\tilde{C}_d} = \frac{1}{C_d}(1 + p_4),$$

-continued $$\tilde{R}_0 = R_0(1 + p_5).$$

Then, a third coefficient, a fourth coefficient, and a fifth coefficient, which are change rates of the estimated value of the SoC$s_k$ for the parameters $p_3$, $p_4$, and $p_s$, are respectively calculated as in the first embodiment by a third coefficient calculation part 1401, a fourth coefficient calculation part 1402, and a fifth coefficient calculation part 1403 respectively corresponding to the parameters $p_3$, $p_4$, and $p_s$.

The error estimation part 1404 uses, in addition to Equation (31), the following relationships:

$$q_{d,k} = e^{-\frac{t_s}{R_d C_d}} q_{d,k-1} + R_d C_d \left(1 - e^{-\frac{t_s}{R_d C_d}}\right) I_{k-1}, \quad (44)$$

$$V_k = E(s_k) + \frac{1}{C_d} q_{d,k} + R_0 I_k. \quad (45)$$

In addition to derivative information including the first coefficient and the second coefficient according to the first embodiment, Equation (32) is extended by adding the third coefficient, the fourth coefficient, and the fifth coefficient as follows:

$$q_{cc,k} = \frac{\tilde{F}_{cc}}{1 + p_2}\left(\tilde{s}_k - \sum_{j=1}^{5} \frac{\partial s_k}{\partial p_j} p_j\right) + t_k I_{typ} p_1 - q_0. \quad (46)$$

Moreover, Equations (44) and (45) can be similarly transformed into:

$$\tilde{q}_{d,k} - \sum_{j=1}^{5} \frac{\partial q_{d,k}}{\partial p_j} p_j = \left(\tilde{F}_{11} - \frac{\partial F_{11}}{\partial p_3} p_3\right)\left(\tilde{q}_{d,k-1} - \sum_{j=1}^{5} \frac{\partial q_{d,k-1}}{\partial p_j} p_j\right) + \quad (47)$$

$$\left(\tilde{G}_1 - \frac{\partial G_1}{\partial p_3} p_3\right)(I_{k-1} - I_{typ} p_1),$$

$$V_k = E(\tilde{s}_k) - \frac{\partial E}{\partial s_k}\sum_{j=0}^{5} \frac{\partial s_k}{\partial p_j} p_j + \quad (48)$$

$$\frac{1 - p_4}{\tilde{C}_d}\left(\tilde{q}_{d,k} - \frac{\partial q_{d,k}}{\partial p_j} p_j\right) + \tilde{R}_0(1 - p_5)(I_k - I_{typ} p_1),$$

where $$\tilde{F}_{11} := e^{-\frac{t_s}{R_d C_d}}, \quad (49)$$

$$\tilde{G}_1 := \tilde{R}_d \tilde{G}_d \left(1 - e^{-\frac{t_s}{R_d C_d}}\right), \quad (50)$$

respectively.

By omitting the high order terms with respect to the parameters, Equations (46), (47), and (48) are transformed into linear relationships in terms of a parameter $p_j$.

The error estimation part 1404 according to the second embodiment minimizes the following objective function J in place of Equation (34):

$$J(\hat{p}_k) := \frac{1}{2}\sum_{l=0}^{k} \lambda^{k-l}(y_l - u_l^T \hat{p}_k)^T \Sigma^{-1}(y_l - u_l^T \hat{p}_k), \quad (51)$$

where Σ is a predetermined positive definite symmetric weighting matrix. Moreover, an observed variable $y_1$ is defined as follows:

$$y_l := \begin{bmatrix} y_{1,l} \\ y_{2,l} \\ y_{3,l} \end{bmatrix} := \begin{bmatrix} q_{cc,k} - \tilde{F}_{cc}\tilde{s}_k \\ \tilde{q}_{d,k} - \tilde{F}_{11}\tilde{q}_{d,k-1} - \tilde{G}_1 I_{k-1} \\ V_k - E(\tilde{s}_k) - \frac{1}{\tilde{C}_d}\tilde{q}_{d,k} - \tilde{R}_0 I_k \end{bmatrix}. \quad (52)$$

Moreover, the explanatory variable $u_k$ is a matrix $[u_{1,k}\ u_{2,k}\ u_{3,k}]$ where $$u_{1,k} := \begin{bmatrix} -\frac{\partial q_{b,k}}{\partial p_1} + I_{typ} t_k \\ -\frac{\partial q_{b,k}}{\partial p_2} \\ -\frac{\partial q_{b,k}}{\partial p_3} \\ -\frac{\partial q_{b,k}}{\partial p_4} \\ -\frac{\partial q_{b,k}}{\partial p_5} \\ -1 \end{bmatrix} \quad (53)$$

$$u_{2,k} := \begin{bmatrix} \frac{\partial q_{d,k}}{\partial p_1} - \tilde{F}_{11}\frac{\partial q_{d,k-1}}{\partial p_1} - \tilde{G}_1 I_{typ} \\ \frac{\partial q_{d,k}}{\partial p_2} - \tilde{F}_{11}\frac{\partial q_{d,k-1}}{\partial p_2} \\ \frac{\partial q_{d,k}}{\partial p_3} - \tilde{F}_{11}\frac{\partial q_{d,k-1}}{\partial p_3} - \frac{\partial F_{11}}{\partial p_3}\tilde{q}_{d,k-1} - \frac{\partial G_1}{\partial p_3}I_{k-1} \\ \frac{\partial q_{d,k}}{\partial p_4} - \tilde{F}_{11}\frac{\partial q_{d,k-1}}{\partial p_4} \\ \frac{\partial q_{d,k}}{\partial p_5} - \tilde{F}_{11}\frac{\partial q_{d,k-1}}{\partial p_5} \\ 0 \end{bmatrix} \quad (54)$$

$$u_{3,k} := \begin{bmatrix} -\frac{1}{\tilde{F}_{cc}}\frac{\partial E}{\partial s_k}\frac{\partial q_{b,k}}{p_1} - \frac{1}{\tilde{C}_d}\frac{\partial q_{d,k}}{\partial p_1} = \tilde{R}_0 I_{typ} \\ -\frac{1}{\tilde{F}_{cc}}\frac{\partial E}{\partial s_k}\left(\frac{\partial q_{b,k}}{p_2} - \tilde{q}_{b,k}\right) - \frac{1}{\tilde{C}_d}\frac{\partial q_{d,k}}{\partial p_2} = \\ -\frac{1}{\tilde{F}_{cc}}\frac{\partial E}{\partial s_k}\frac{\partial q_{b,k}}{p_3} - \frac{1}{\tilde{C}_d}\frac{\partial q_{d,k}}{\partial p_3} \\ -\frac{1}{\tilde{F}_{cc}}\frac{\partial E}{\partial s_k}\frac{\partial q_{b,k}}{p_4} - \frac{1}{\tilde{C}_d}\left(\frac{\partial q_{d,k}}{\partial p_4} + \tilde{q}_{d,k}\right) \\ -\frac{1}{\tilde{F}_{cc}}\frac{\partial E}{\partial s_k}\frac{\partial q_{b,k}}{p_5} - \frac{1}{\tilde{C}_d}\frac{\partial q_{d,k}}{p_5}\tilde{R}_0 I_k \\ 0 \end{bmatrix}. \quad (55)$$

In place of Equation (37), let RLS gain $g_k$ be defined as:

$$g_k = Y_{k-1} u_k (\lambda \Sigma + u_k^T Y_{k-1} u_k)^{-1}, \quad (56)$$

in combination with Equations (38) and (39), the estimated parameter vector $\hat{p}_k$ can be estimated completely in the same way as in the first embodiment.

Figure 15:
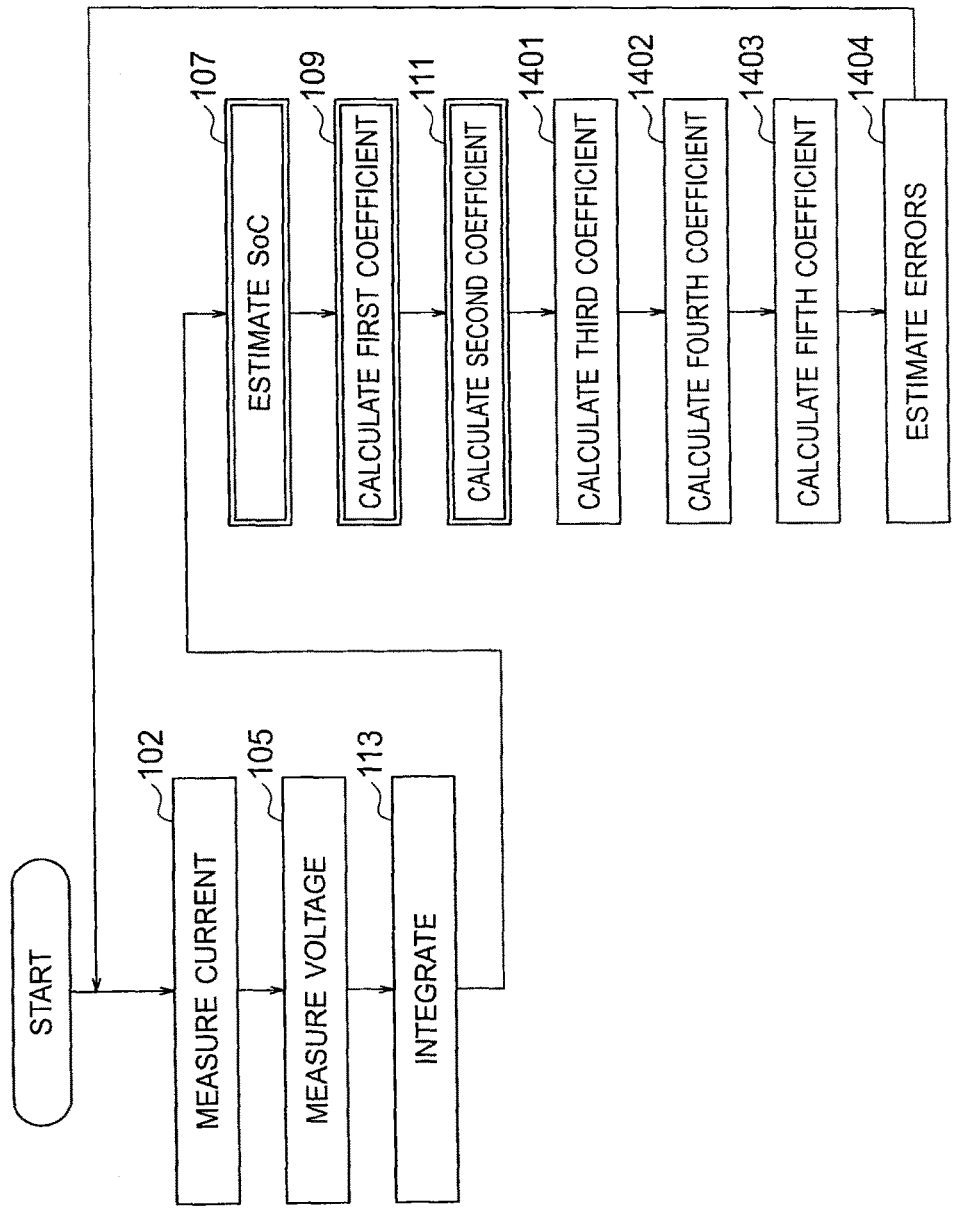
FIG. 15 is a flowchart of a rechargeable battery parameter estimation method according to the second embodiment of the present invention.

FIG. 15 is a flowchart of a rechargeable battery parameter estimation method according to the second embodiment of the present invention. Each step of the flowchart corresponds to a processing executed by the corresponding part of the rechargeable battery parameter estimation apparatus 101 illustrated in FIG. 14. It should be noted that an execution sequence by the rechargeable battery parameter estimation apparatus 101 according to the second embodiment is not limited to the execution sequence illustrated in FIG. 15. The execution sequence of the steps can be shuffled as long as the dependencies among the steps are not violated.

As described above, according to the second embodiment, the offset error 116 of the current measurements and the capacity error 117 of the FCC can be estimated while the errors in the characteristic parameters $R_d$, $C_d$, and $R_0$ of the equivalent circuit of the battery 103 illustrated in FIG. 2 are considered.

It should be noted that the rechargeable battery parameter estimation apparatus 101 according to the second embodiment is not limited to the configuration for correcting the characteristic parameters of the equivalent circuit illustrated in FIG. 2. For example, considering a circuit includes plural CR circuits or a diffusion impedance and the like as the equivalent circuit, and a configuration for correcting parameters included therein may be employed.

Moreover, a temperature dependency of parameters such as the resistances and the diffusion coefficient may be expressed by the Arrhenius equation or the like, and a frequency factor, an activation energy, and the like included therein may be corrected as parameters. A configuration for estimating only a part of the characteristic parameters $R_d$, $C_d$, and $R_0$ of the equivalent circuit may be employed.

Third Embodiment

In the first embodiment, the estimated parameter vector $\hat{p}_k$ is estimated from the explanatory variable $u_k$ and the observed variable $y_k$ defined by Equations (35) and (36). On this occasion, the first element of the explanatory variable $u_k$ includes a term proportional to $t_k$, and the term unboundedly increases as the time elapses. A calculation process including an amount unboundedly increasing in this way is not appropriate for a software implementation in embedded systems.

A third embodiment of the present invention serves to solve this problem, and effects similar to those of the first and second embodiments are provided without directly treating the unboundedly increasing amount by considering the observed variable $y_k$ and the explanatory variable $u_k$ in an affine space. A description is now given mainly of the difference of a rechargeable battery parameter estimation apparatus 101 according to the third embodiment from the rechargeable battery parameter estimation apparatus 101 according to the first embodiment.

First, weighted time averages of the observed variable $y_k$ and the explanatory variable $u_k$ are defined by:

$$\langle y_k \rangle := \frac{1}{S_k} \sum_{l=0}^{k} \lambda^{k-1} y_l; \langle u_k \rangle := \frac{1}{S_k} \sum_{l=0}^{k} \lambda^{k-1} u_l, \tag{57}$$

where $S_k$ is a sum of the first k terms of a geometric sequence having the scale factor of 1 and having a common ratio of $\lambda$. On this occasion, a vector space to which a pair $(y_k, u_k)$ belongs is considered as an affine space, and a local coordinate $(z_1, v_1)$ at a time point $t_k$ is defined as $z_1 := y_1 - y_k$ and $v_1 := u_1 - u_k$. Then, weighted time averages of the observed variable $y_k$ and the explanatory variable $u_k$ represented in the local coordinate are calculated by:

$$\langle z_k \rangle = \lambda \frac{S_{k-1}}{S_k} [\langle z_{k-1} \rangle - (y_k - y_{k-1})], \tag{58}$$

$$\langle v_k \rangle = \lambda \frac{S_{k-1}}{S_k} [\langle v_{k-1} \rangle - (u_k - u_{k-1})]. \tag{59}$$

Both differences $y_k - y_{k-1}$ and $u_k - u_{k-1}$ are bounded, and $\lambda S_{k-1}/S_k$ is less than 1, and hence $z_k$ and $v_k$ are always bounded.

On this occasion, the estimated parameter vector $\hat{p}_k$ can be calculated as in the error estimation part 115 according to the first embodiment by replacing the observed variable $y_k$ with $\langle z_k \rangle$, and replacing the explanatory variable $u_k$ with $\langle v_k \rangle$. It should be noted that, in the third embodiment, the parameters are considered in the affine space, and $q_0$ cannot thus be estimated. Thus, the explanatory variable $u_k$ forms a two-dimensional vector by stripping the last element of −1, and the estimated parameter vector $\hat{p}_k$ also forms a two-dimensional vector.

Figure 16:
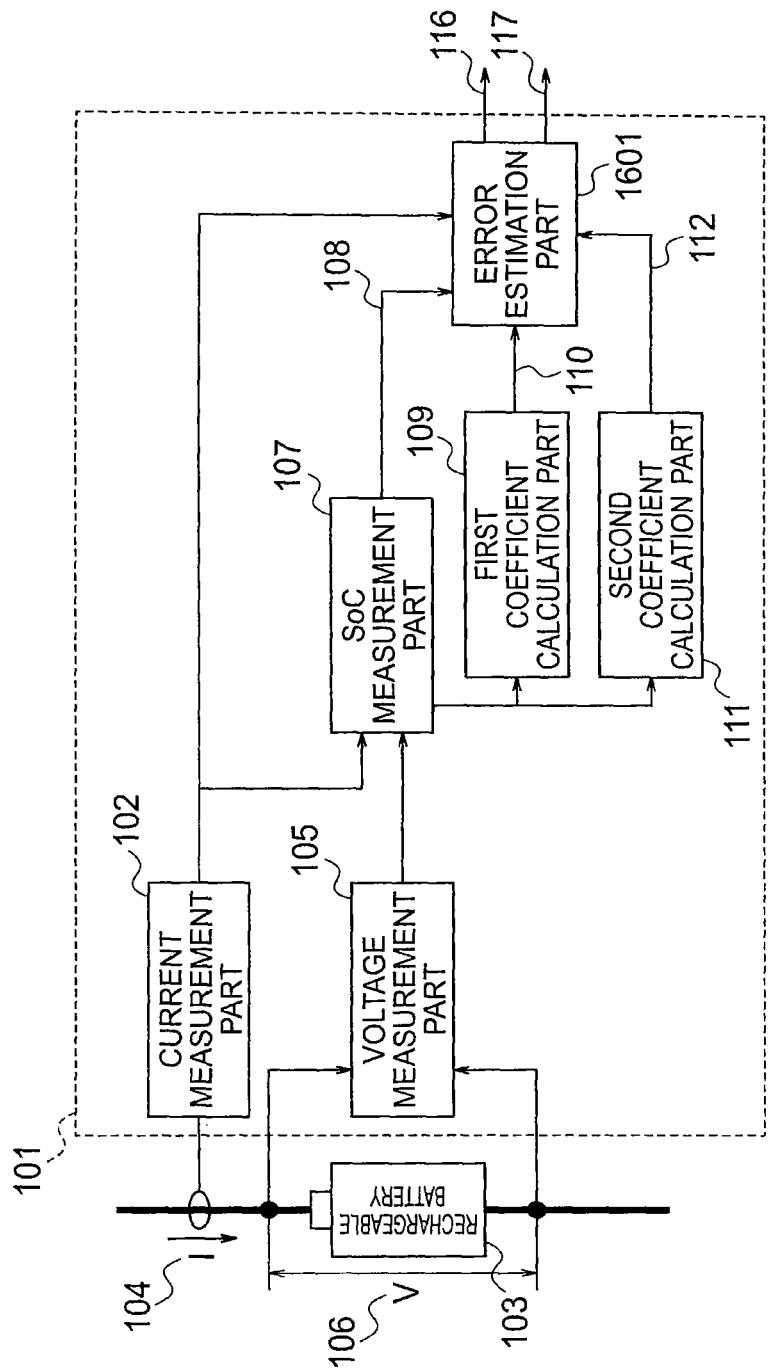
FIG. 16 is an overall configuration diagram of a rechargeable battery parameter estimation apparatus according to a third embodiment of the present invention.

FIG. 16 is an overall configuration diagram of a rechargeable battery parameter estimation apparatus 101 according to the third embodiment of the present invention. The rechargeable battery parameter estimation apparatus 101 according to the third embodiment has the same configuration as that of the rechargeable battery parameter estimation apparatus 101 according to the first embodiment except for such a point that the current integration part 113 is no longer necessary, and the current 104 measured by the current measurement part 102 is directly input to an error estimation part 1601.

Figure 17:
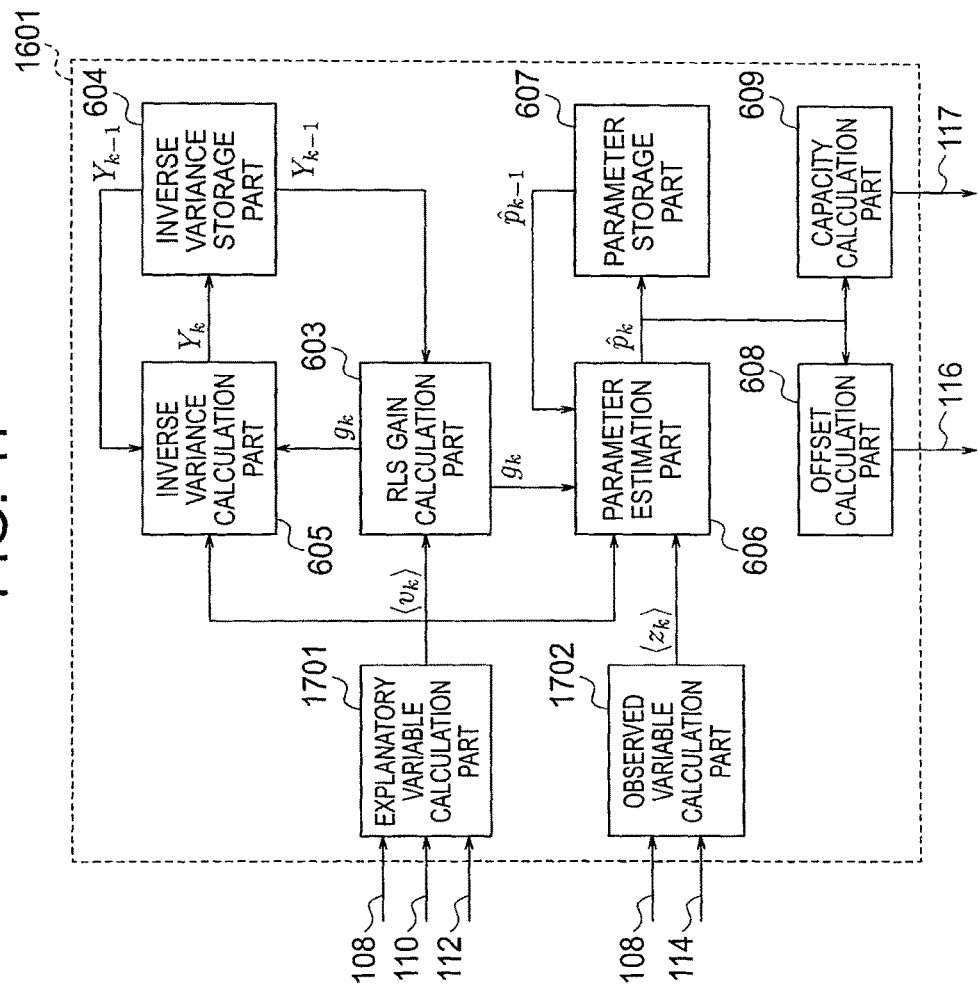
FIG. 17 is an overall configuration diagram of an error estimation part according to the third embodiment of the present invention.

FIG. 17 is an overall configuration diagram of the error estimation part 1601 according to the third embodiment of the present invention. The error estimation part 1601 according to the third embodiment has the same configuration as that of the error estimation part 115 of the first embodiment except for such a point that the current 104 is input to an observed variable calculation part 1702 in place of the current integrated value 114.

Figure 18:
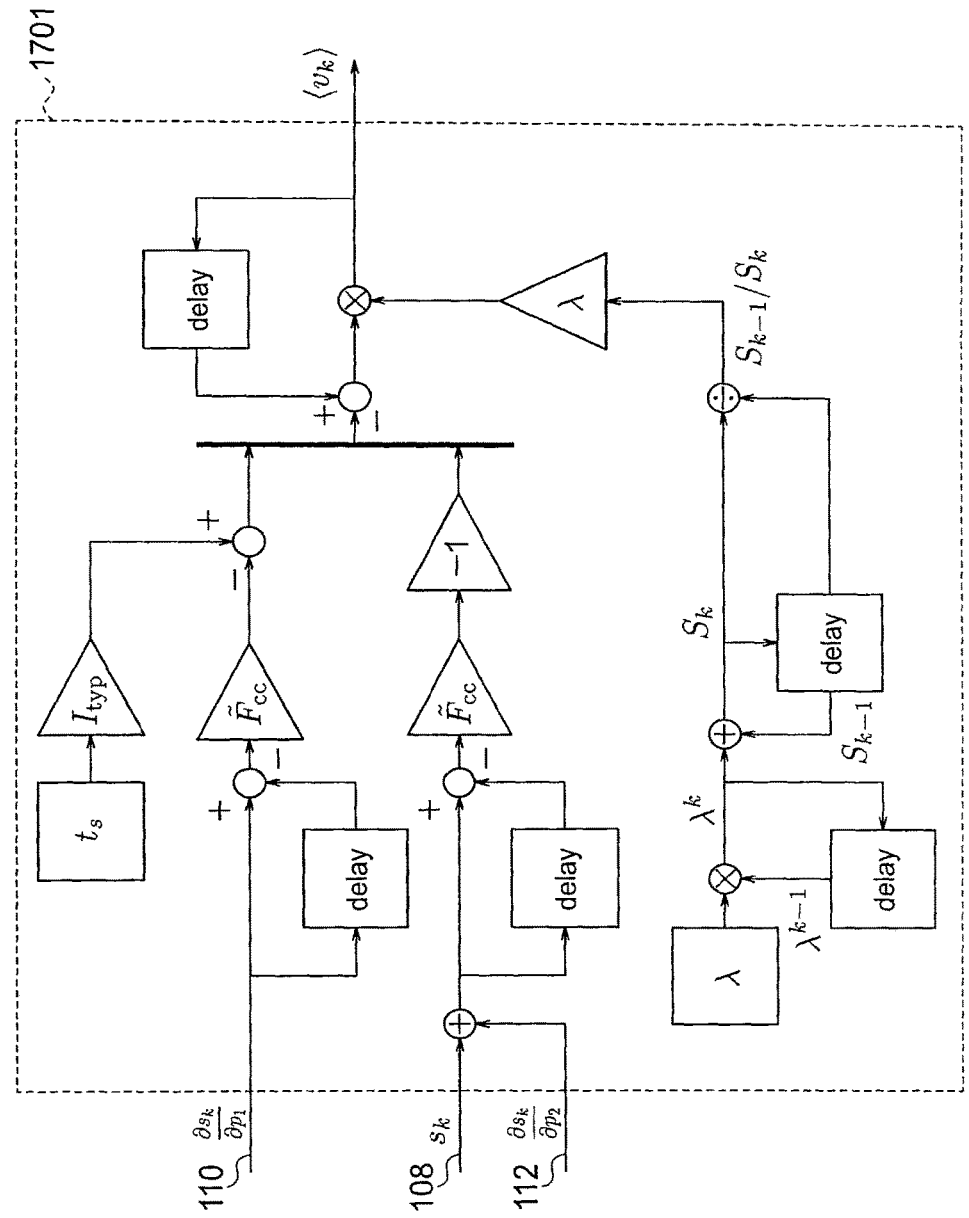
FIG. 18 is a block diagram of an explanatory variable calculation part according to the third embodiment of the present invention.

FIG. 18 is a block diagram of an explanatory variable calculation part 1701 according to the third embodiment of the present invention. A first element of the explanatory variable $u_k - u_{k-1}$ is calculated by acquiring a difference by subtracting the first coefficient 110 of previous sampling from the first coefficient 110 calculated by the first coefficient calculation part 109, and subtracting a product acquired by multiplying the difference by the typical FCC $F_{cc}$ from a product acquired by multiplying the sampling period $t_s$ by a constant $I_{typ}$.

A second element of the explanatory variable $u_k - u_{k-1}$ is calculated by acquiring a sum of the estimated value of the SoC 108 calculated by the SoC estimation part 107 and the second coefficient 112 calculated by the second coefficient calculation part 111, acquiring a difference of the calculated sum from the value at the previous sampling, further acquiring a product by multiplying the difference by the typical FCC $F_{cc}$, and negating the product.

On the other hand, $\lambda_k$ is calculated by multiplying $\lambda_{k-1}$ calculated at the previous sampling by the predetermined forgetting factor $\lambda$. The geometric series $S_k$, which is a sum of the first k terms of the geometric sequence having a scale factor of 1 and the common ratio $\lambda$, is calculated by adding $\lambda_k$ to the geometric series $S_{k-1}$ calculated at the previous sampling. $\lambda S_{k-1}/S_k$ is calculated by acquiring a ratio of $S_{k-1}$ to $S_k$, and multiplying the ratio by the factor $\lambda$. The explanatory variable $\langle v_k \rangle$ is calculated by acquiring a difference between $\langle v_{k-1} \rangle$ at the previous sampling and the explanatory variable $u_k - u_{k-1}$, and further multiplying the difference by $\lambda S_{k-1}/S_k$.

Figure 19:
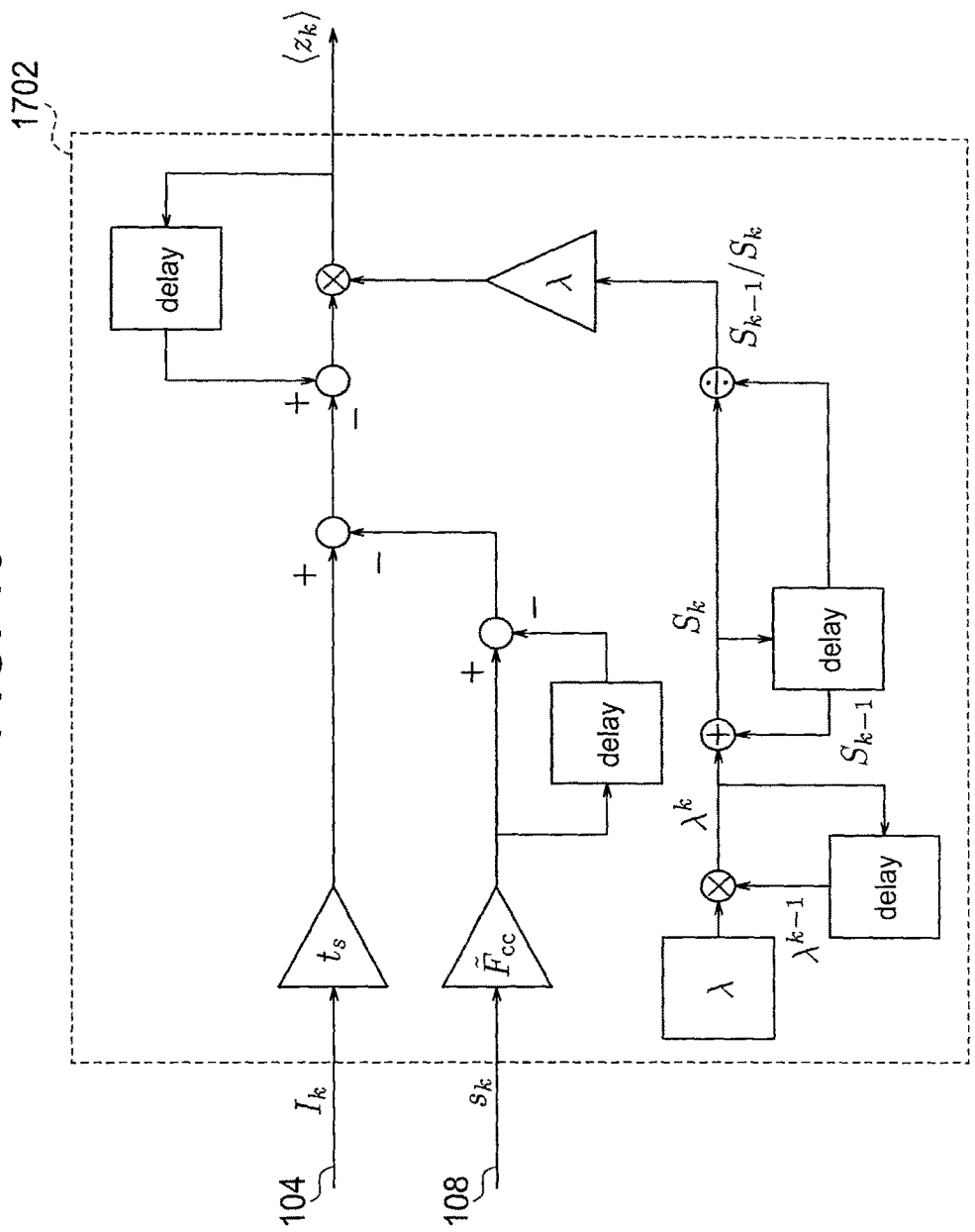
FIG. 19 is a block diagram of an observed variable calculation part according to the third embodiment of the present invention.

FIG. 19 is a block diagram of the observed variable calculation part 1702 according to the third embodiment of the present invention. The observed variable $y_k - y_{k-1}$ is calculated by acquiring a product by multiplying the estimated value of the SoC 108 calculated by the SoC estimation part 107 by the typical FCC $F_{cc}$, acquiring a difference of the product from that at the previous sampling, and subtracting the difference from a product acquired by multiplying the current 104 by the sampling period $t_s$. The observed variable $<z_k>$ is calculated by acquiring a difference between $<Z_{k-1}>$ at the previous sampling and the observed variable $y_k - y_{k-1}$, and further multiplying the difference by $\lambda S_{k-1}/S_k$.

For combining the third embodiment with the second embodiment of the present invention, it is only required that the symbol $y_k$ is reinterpreted as a vector, and the symbol $u_k$ is reinterpreted as a matrix. Moreover, in the calculation of the explanatory variable and the observed variable, the terms $u_k - u_{k-1}$, and the like have to be calculated as defined except the terms relating to the time point $t_k$ and a current integration amount $q_{cc,k}$.

Figure 20:
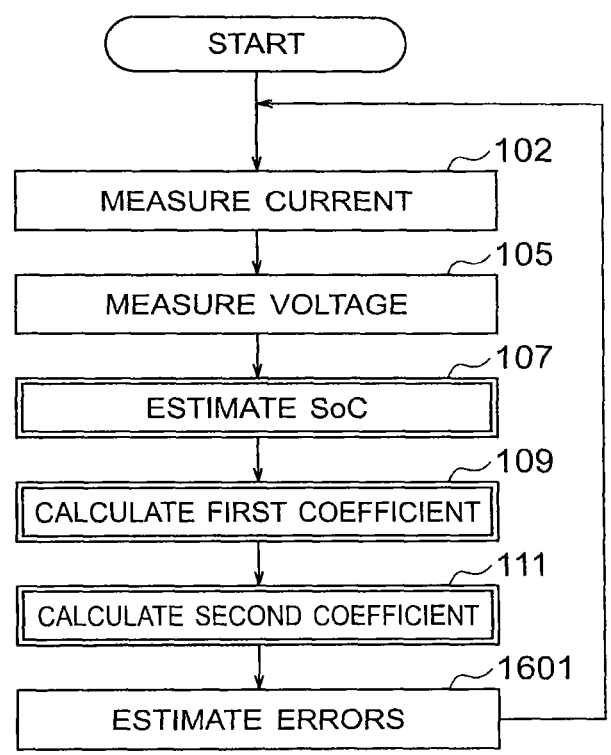
FIG. 20 is a flowchart of a rechargeable battery parameter estimation method according to the third embodiment of the present invention.

FIG. 20 is a flowchart of a rechargeable battery parameter estimation method according to the third embodiment of the present invention. Each step of the flowchart corresponds to a processing executed by the corresponding part of the rechargeable battery parameter estimation apparatus 101 illustrated in FIG. 16. It should be noted that an execution sequence of the rechargeable battery parameter estimation apparatus 101 according to the third embodiment is not limited to the execution sequence illustrated in FIG. 20. The execution sequence of the steps can be shuffled as long as the dependencies among the steps are not violated.

Figure 21:
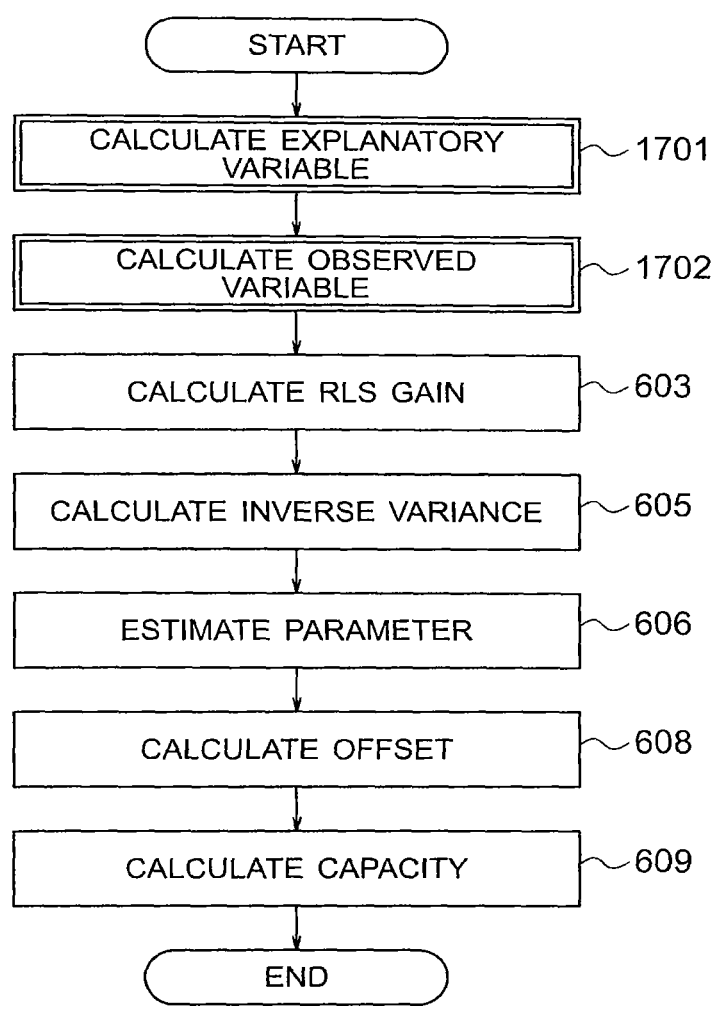
FIG. 21 is a flowchart of a processing executed by the error estimation part in a cycle of periodic operations according to the third embodiment of the present invention.

FIG. 21 is a flowchart of a processing executed by the error estimation part 1601 in a cycle of periodic operations according to the third embodiment of the present invention. Each step of the flowchart corresponds to a processing executed by the corresponding part of the error estimation part 1601 illustrated in FIG. 17. It should be noted that an execution sequence by the error estimation part 1601 according to the third embodiment is not limited to the execution sequence illustrated in FIG. 21. The execution sequence of the steps can be shuffled as long as the dependencies among the steps are not violated.

As described above, according to the third embodiment, without directly treating the amount unboundedly increasing as the time elapses, the same effects as those of the first embodiment can be achieved.

Fourth Embodiment

In the first embodiment, the recursive least squares filter (RLS filter) is used to estimate the offset error 116 of the current measurement and the capacity 117 error of the FCC. This method provides the optimal estimation in terms of the mean square error only if a random error is superimposed only on the observed variable $y_k$, and a random error on the explanatory variable $u_k$ is negligibly small.

However, it is known that if the explanatory variable $u_k$ has a large random error, the estimated value is biased. A fourth embodiment of the present invention solves this problem by using the recursive total least squares filter (RTLS filter) to estimate the offset error 116 of the current measurements and the capacity error 117 of the FCC.

In the fourth embodiment, the rechargeable battery parameter estimation apparatus 101 is designed to find the estimated parameter vector $\hat{p}_k$ which minimizes the following objective function J defined by:

$$J(\hat{p}_k) := \frac{1}{2} \sum_{l=0}^{k} \lambda^{k-l} \delta_l^2 + \epsilon_l^T W^{-1} \epsilon_l \tag{60}$$

in place of Equation (51), where $\delta_k$ and $\epsilon_k$ satisfy the following equation for an arbitrary k:

$$y_k - \delta_k = \hat{p}_k^T (u_k - \epsilon_k), \tag{61}$$

where $u_k$ is the explanatory variable and $y_k$ is the observed variable. Let $y_k := y_1 - \delta_1$ and $\hat{u}_1 := u_1 - \epsilon_1$, a relationship $$\hat{y}_1 = \hat{p}_k^T \hat{u}_1 \tag{62}$$

holds from Equation (61). Using this equation, Equation (60) is able to be transformed into:

$$J(\hat{p}_k) = \frac{1}{2} \sum_{l=0}^{k} \lambda^{k-l} \left( \begin{bmatrix} y_l \\ u_l \end{bmatrix} - \begin{bmatrix} \hat{p}_k^T \\ I \end{bmatrix} \hat{u}_l \right)^T \begin{bmatrix} 1 & \\ & W^{-1} \end{bmatrix} \left( \begin{bmatrix} y_l \\ u_l \end{bmatrix} - \begin{bmatrix} \hat{p}_k^T \\ I \end{bmatrix} \hat{u}_l \right). \tag{63}$$

The vector $\hat{u}_1$ which minimizes Equation (63) is obtained as a solution of the following equation:

$$-\begin{bmatrix} \hat{p}_k & I \end{bmatrix} \begin{bmatrix} 1 & \\ & W^{-1} \end{bmatrix} \left( \begin{bmatrix} y_l \\ u_l \end{bmatrix} - \begin{bmatrix} \hat{p}_k^T \\ I \end{bmatrix} \hat{u}_l \right) = 0. \tag{64}$$

Now, let $$A_k := \begin{bmatrix} \hat{p}_k^T \\ I \end{bmatrix}, \quad \Lambda := \begin{bmatrix} 1 & \\ & W^{-1} \end{bmatrix}, \quad \xi_l := \begin{bmatrix} y_l \\ u_l \end{bmatrix}, \tag{65}$$

the solution of Equation (64) is written as:

$$\hat{u}_l := (A_k^T \Lambda A_k)^{-1} A_k^T \Lambda \xi_l. \tag{66}$$

Substituting the solution to Equation (63), Equation (63) is transformed into:

$$J(\hat{p}_k) = \frac{1}{2} \sum_{l=0}^{k} \lambda^{k-l} \xi_l^T [\Lambda - \Lambda A_k (A_k^T \Lambda A_k)^{-1} A_k^T \Lambda] \xi_l. \tag{67}$$

Further, let $\Lambda^{1/2}$ denote the Cholesky decomposition of the matrix $\Lambda$, $B_k := \Lambda^{1/2} A_k$ and $\zeta_1 := \Lambda^{1/2} \xi_1$, the following equation holds:

$$J(\hat{p}_k) = \frac{1}{2} \sum_{l=0}^{k} \lambda^{k-l} \zeta_l^T [I - B_k (B_k^T B_k)^{-1} B_k^T] \zeta_l. \tag{68}$$

On this occasion, a non-zero vector $b_k$ exists such that $B_k^T b_k = 0$, because the null space of the matrix $A_k^T$ is 1-dimensional. This $b_k$ is unique except for scalar multiples. Because of the proparties of a projection, the vector $b_k$ satisfies the following relationship:

$$I - B_k (B_k^T B_k)^{-1} B_k^T = \frac{b_k b_k^T}{b_k^T b_k}. \tag{69}$$

Consequently, Equation (68) is transformed into follows:

$$J(\hat{p}_k) = \frac{1}{2}\sum_{l=0}^{k} \lambda^{k-l}\zeta_l^T \frac{b_k b_k^T}{b_k^T b_k}\zeta_l \quad (70)$$

$$= \frac{1}{2}\sum_{l=0}^{k} \lambda^{k-l} \frac{b_k^T \zeta_l \zeta_l^T b_k}{b_k^T b_k}$$

$$= \frac{1}{2b_k^T b_k} b_k^T \tilde{R}_k b_k, \text{ where } \tilde{R}_k := \sum_{l=0}^{k} \lambda^{k-l}\zeta\zeta^T.$$

Remark $B_k^T b_k = 0$, namely, $A_k^T \Lambda^{1/2} b_k = 0$, and thus, let $a_k := \Lambda^{1/2} b_k$, Equation (70) is further transformed into:

$$J(\hat{p}_k) = \frac{1}{2} \frac{a_k^T R_k a_k}{a_k^T \Lambda a_k}, \text{ where } R_k := \sum_{l=0}^{k} \lambda^{k-l}\xi\xi^T. \quad (71)$$

Therefore, $a_k$ is obtained as an eigenvector corresponding to the minimum eigenvalue which is a solution of a generalized eigenvalue problem relating to the pair $(R_k, \Lambda)$. Remark $A_k^T a_k = 0$ again, and let $a_{0,k}$ denote the first element of the vector $a_k$ and $a^{\hat{}}_k$ denote the other elements, $\hat{p}_k a_0$, $_k = a^{\hat{}}_k$. Thus, the estimated parameter vector $\hat{p}_k$ is expressed by $a^{\hat{}}_k/a_{0,k}$.

As a method of finding the eigenvector, a publicly known method may be used. For example, the Householder transformation, the Givens rotation method, and the Arnoldi's method are known. On this occasion, the covariance matrix $R_k$ is a positive definite symmetric matrix, thus the Lanczos algorithm can be used. Further, it is required to find only the eigenvector corresponding to the minimum eigenvalue, and hence the inverse iteration and the Rayleigh quotient iteration are also applicable.

A description is now mainly given of the difference of a rechargeable battery parameter estimation apparatus 101 according to the fourth embodiment from the rechargeable battery parameter estimation apparatus 101 according to the first embodiment.

Figure 22:
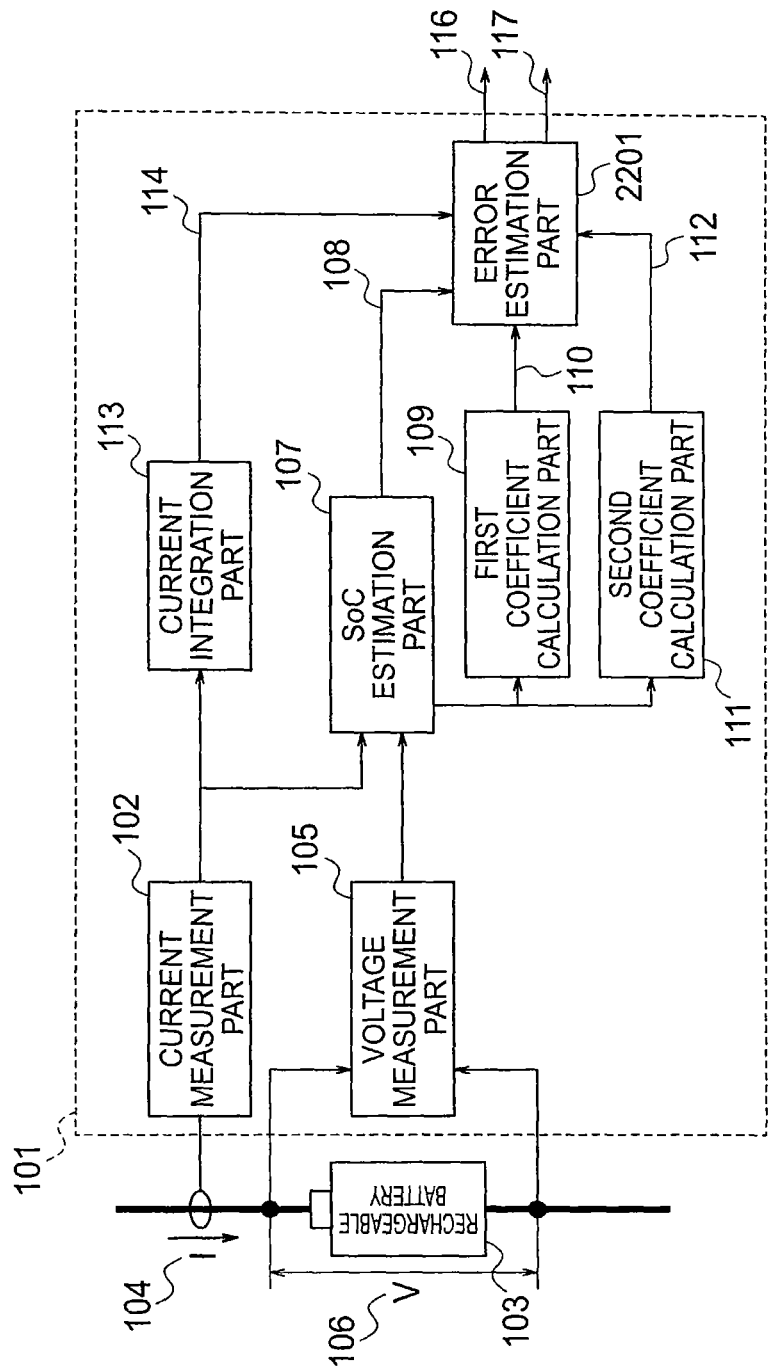
FIG. 22 is an overall configuration diagram of a rechargeable battery parameter estimation apparatus according to a fourth embodiment of the present invention.

FIG. 22 is an overall configuration diagram of the rechargeable battery parameter estimation apparatus 101 according to the fourth embodiment of the present invention. The rechargeable battery parameter estimation apparatus 101 according to the fourth embodiment has the same configuration as that of the rechargeable battery parameter estimation apparatus 101 according to the first embodiment except for an error estimation part 2201.

Figure 23:
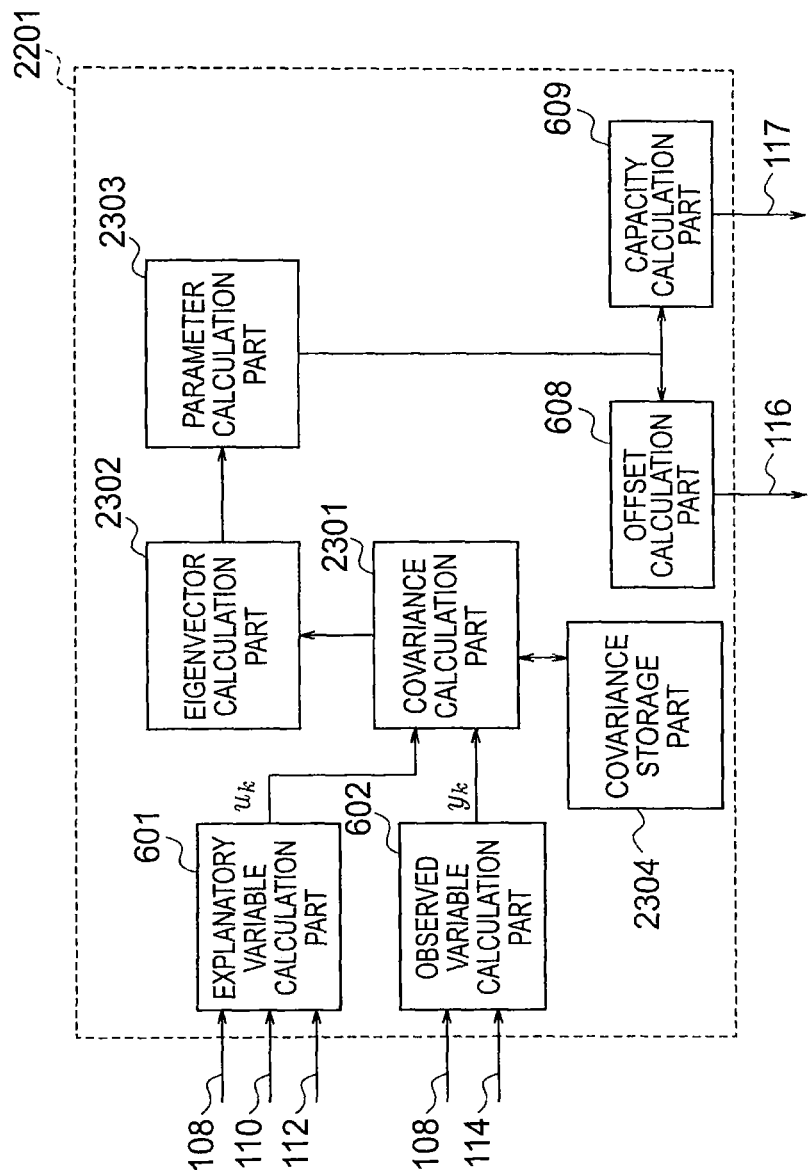
FIG. 23 is an overall configuration diagram of an error estimation part according to the fourth embodiment of the present invention.

FIG. 23 is an overall configuration diagram of the error estimation part 2201 according to the fourth embodiment of the present invention. The explanatory variable calculation part 601 and the observed variable calculation part 602 are the same as those of the first embodiment.

A covariance calculation part 2301 calculates a covariance matrix $R_k$ from a covariance matrix $R_{k-1}$ at the previous sampling stored in a covariance storage part 2304, the explanatory variable $u_k$ calculated by the explanatory variable calculation part 601, and the observed variable $y_k$ calculated by the observed variable calculation part 602 by following a recursive equation:

$$R_k = \lambda R_{k-1} + \xi_k \xi_k^T, \quad (72)$$

and stores a result in the covariance storage part 2304.

An eigenvector calculation part 2302 solves the generalized eigenvalue problem of Equation (71) based on the covariance matrix $R_k$ calculated by the covariance calculation part 2301 and a predetermined weighting matrix $\Lambda$, and acquires the eigenvector $a_k$ corresponding to the minimum eigenvalue.

An parameter calculation part 2303 calculates the estimated parameter vector $\hat{p}_k$ by dividing the second or subsequent elements of $a_k$ by the first element thereof. The offset calculation part 608 and the capacity calculation part 609 are the same as those of the first embodiment.

Figure 24:
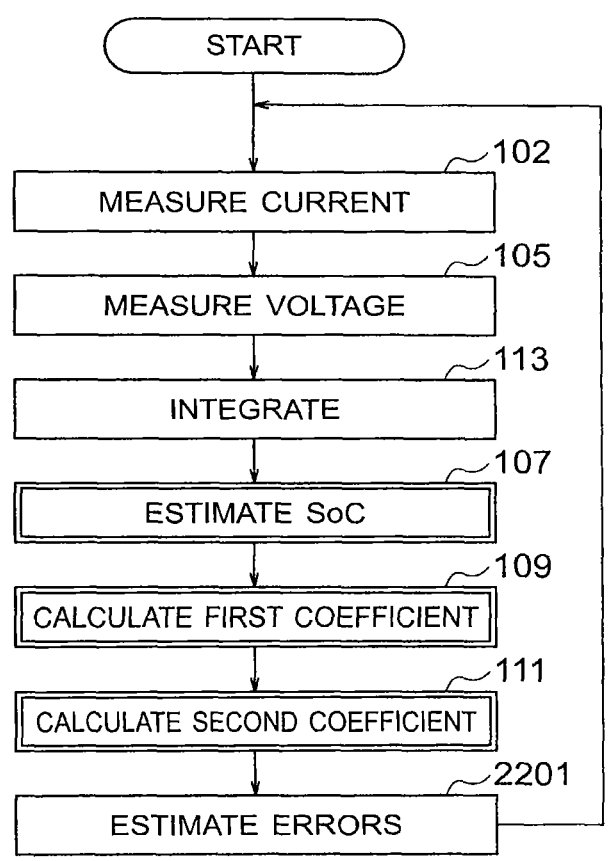
FIG. 24 is a flowchart of a rechargeable battery parameter estimation method according to the fourth embodiment of the present invention.

FIG. 24 is a flowchart of the rechargeable battery parameter estimation method. Each step of the flowchart corresponds to a processing executed by the corresponding part of the rechargeable battery parameter estimation apparatus 101 illustrated in FIG. 22. It should be noted that an execution sequence of the rechargeable battery parameter estimation apparatus 101 according to the fourth embodiment is not limited to the execution sequence illustrated in FIG. 24. The execution sequence of the steps can be shuffled as long as the dependencies among the steps are not violated.

Figure 25:
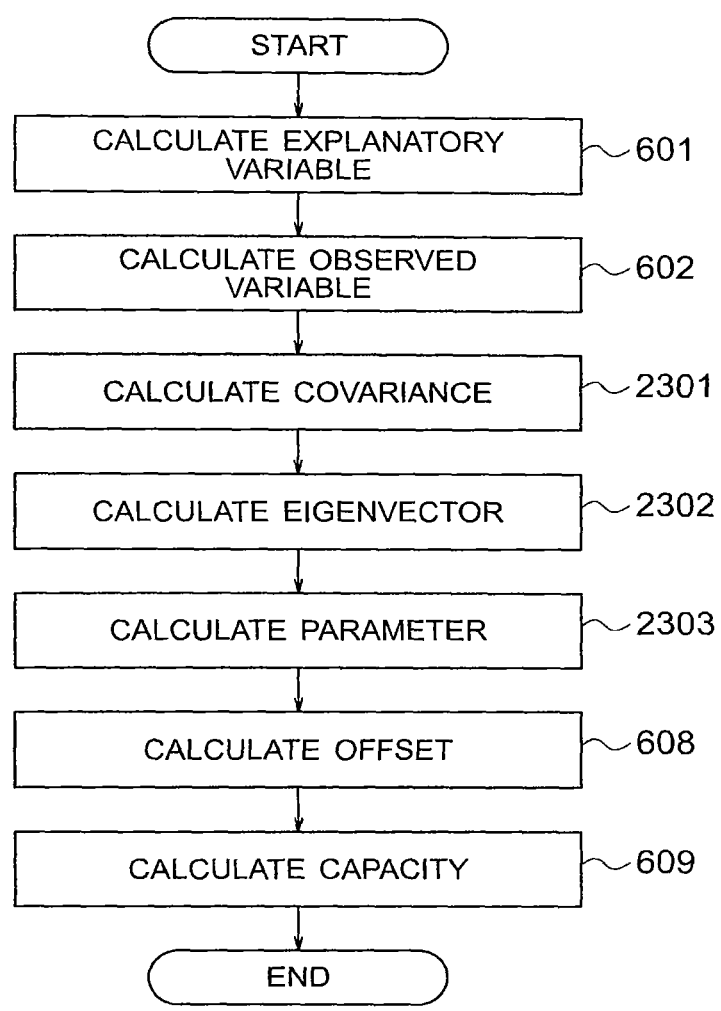
FIG. 25 is a flowchart of a processing executed by the error estimation part in a cycle of periodic operations according to the fourth embodiment of the present invention.

FIG. 25 is a flowchart of a processing executed by the error estimation part 2201 according to the fourth embodiment of the present invention. Each step of the flowchart corresponds to a processing executed by the corresponding part of the error estimation part 2201 illustrated in FIG. 23. It should be noted that an execution sequence of the error estimation part 2201 according to the fourth embodiment is not limited to the execution sequence illustrated in FIG. 25. The execution sequence of the steps can be shuffled as long as the dependencies among the steps are not violated.

The fourth embodiment can be combined with the second embodiment. In order to achieve this, let $\Sigma$ denote a positive definite symmetric weighting matrix, it is only required that the covariance $R_k$ is calculated as:

$$R_k = \lambda R_{k-1} + \begin{bmatrix} y_{1,k} & y_{2,k} & y_{3,k} \\ u_{1,k} & u_{2,k} & u_{3,k} \end{bmatrix} \Sigma^{-1} \begin{bmatrix} y_{1,k} & y_{2,k} & y_{3,k} \\ u_{1,k} & u_{2,k} & u_{3,k} \end{bmatrix}^T. \quad (73)$$

The fourth embodiment can be combined with the third embodiment. This is apparent by considering that a difference between the first embodiment and the third embodiment is limited to the explanatory variable calculation part 601 and the observed variable calculation part 602. It should be understood that, as described in the third embodiment, the third embodiment combined with the second embodiment can further be combined with the fourth embodiment.

As described above, according to the fourth embodiment, even if measurements of the current 104 and the voltage 106 have large random errors, the same effects as those of the first embodiment can be provided.

Fifth Embodiment

The rechargeable battery parameter estimation apparatus 101 according to the fourth embodiment solves the generalized eigenvalue problem in the eigenvector calculation part 2302, and this is generally a processing having a large calculation complexity. Thus, in a fifth embodiment of the present invention, a configuration is disclosed where a method disclosed in D.-Z. Feng, X.-D. Zhang, D.-X. Chang and W. X. Zheng, "A fast recursive total least squares algorithm for adaptive FIR filtering," IEEE Transaction on Signal Processing, vol. 52, No. 10, 2004 is applied to reduce the calculation complexity by using the fact that the covariance matrix $R_k$ changes only in a gradual manner.

First, the estimated parameter vector $\hat{p}_k$ is expressed as $\hat{a}_k/a_{0,k}$, and the estimated parameter vector $\hat{p}_k$ has a freedom of scaling, and thus $\hat{p}_k$ can be parameterized as $[-1 \ a_k^T]^T$.

Then the following update scheme:

$$\hat{p}_k = \hat{p}_{k-1} + \theta_k w_k \quad (74)$$

is employed where $\theta_k$ is a scalar, $w_k$ is a time series such that a series $(w_k, w_{k-1}, \ldots)$ efficiently spans an image of $A_k$.

Although the explanatory variable $u_k$ is used as $w_k$ according to D.-Z. Feng, X.-D. Zhang, D.-X. Chang and W. X. Zheng, "A fast recursive total least squares algorithm for adaptive FIR filtering," IEEE Transaction on Signal Processing, vol. 52, No. 10, 2004, a random non-zero vector is employed in the fourth embodiment in the present invention. As another option, for example, generation and use of a directional vector orthogonal to previous n−1 $w_k$s is conceivable.

As the scalar $\theta_k$ included in Equation (74), the scalar $\theta_k$ that minimizes the objective function J represented as Equation (71) is calculated. By substituting Equation (74) to Equation (71) is rewritten as follows:

$$J(\hat{p}_{k-1} + \theta_k w_k) = \quad (75)$$

$$\frac{N_k}{D_k} := \frac{1}{2} \frac{[-1 \ \hat{p}_{k-1}^T + \theta_k w_k^T] \begin{bmatrix} d_k & c_k^T \\ c_k & Q_k \end{bmatrix} \begin{bmatrix} -1 \\ \hat{p}_{k-1} + \theta_k w_k \end{bmatrix}}{[-1 \ \hat{p}_{k-1}^T + \theta_k w_k^T] \begin{bmatrix} 1 & \\ & W^{-1} \end{bmatrix} \begin{bmatrix} -1 \\ \hat{p}_{k-1} + \theta_k w_k \end{bmatrix}},$$

where $$\begin{bmatrix} d_k & c_k^T \\ c_k & Q_k \end{bmatrix} = R_k. \quad (76)$$

A scalar $\theta_k$, which minimizes Equation (75), is given as a solution of the following equation:

$$\frac{\partial}{\partial \theta_k} J(\hat{p}_{k-1} + \theta_k w_k) = \frac{\frac{\partial N_k}{\partial \theta_k} D_k - N_k \frac{\partial D_k}{\partial \theta_k}}{D_k^2} = 0. \quad (77)$$

Because of the denominator $D_k^2$ is always strictly positive, and thus it is sufficient that a $\theta_k$ which make a numerator equal to zero. On this occasion, the numerator $N_k$ and the denominator $D_k$ are expanded into:

$$N_k = w_k^T Q_k w_k \theta_k^2 + 2(w_k^T Q_k \hat{p}_{k-1} - c_k^T w_k)\theta_k + \quad (78)$$
$$(\hat{p}_{k-1}^T Q_k \hat{p}_{k-1} - 2c_k^T \hat{p}_{k-1} + d_k),$$

$$D_k = w_k^T W w_k \theta_k^2 + 2 w_k^T W \hat{p}_{k-1} \theta_k + (1 + \hat{p}_{k-1}^T W \hat{p}_{k-1}). \quad (79)$$

For simplicity, the numerator $N_k$ is rewritten as $N_{2,k}\theta_k^2 + 2N_{1,k}\theta_k + N_{0,k}$, and the denominator $D_k$ is written as $D_{2,k}\theta_k^2 + 2D_{1,k}\theta_k + D_{0,k}$, derivatives of those terms with respect to the scalar $\theta_k$ are expressed $dN_k/d\theta_k = 2N_{2,k}\theta_k + 2N_{1,k}$, $dD_k/d\theta_k = 2D_{2,k}\theta_k + 2D_{1,k}$, respectively. Thus, the numerator of Equation (77) is written as:

$$\frac{\partial N_k}{\partial \theta_k} D_k - N_k \frac{\partial D_k}{\partial \theta_k} = 2(N_{2,k} D_{1,k} - N_{1,k} D_{2,k})\theta_k^2 + \quad (80)$$
$$2(N_{2,k} D_{0,k} - N_{0,k} D_{2,k})\theta_k + 2(N_{1,k} D_{0,k} - N_{0,k} D_{1,k}).$$

For simplicity, Equation (80) is rewritten as $2\alpha_k \theta_k^2 + 2\beta_k \theta_k + 2\gamma_k \theta_k$. This is a quadratic expression, which possibly has two distinct real roots:

$$\theta_k^- = \frac{-\beta_k - \sqrt{\beta_k^2 - 4\alpha_k \gamma_k}}{2\alpha_k}, \ \theta_k^+ = \frac{-\beta_k + \sqrt{\beta_k^2 - 4\alpha_k \gamma_k}}{2\alpha_k}. \quad (81)$$

According to first derivative tests with respect to the objective function J shown in Tables 1 and 2, the root $\theta^+_k$ is apparently the solution that minimizes J. It should be noted that C is a constant $N_{2,k}/D_{2,k}$ in the tables.

TABLE 1

| First derivative test of J for $\alpha_k > 0$ | | | | | | | | |
|---|---|---|---|---|---|---|---|---|
| $\theta_k$ | −∞ | | $\theta^-_k$ | | $\theta^+_k$ | | ∞ |
| $dJ/d\theta_k$ | 0 | POSITIVE | 0 | NEGATIVE | 0 | POSITIVE | 0 |
| J | C | INCREASE | | DECREASE | | INCREASE | C |

TABLE 2

| First derivative test of J for $\alpha_k < 0$ | | | | | | | | |
|---|---|---|---|---|---|---|---|---|
| $\theta_k$ | −∞ | | $\theta^+_k$ | | $\theta^-_k$ | | ∞ |
| $dJ/d\theta_k$ | 0 | NEGATIVE | 0 | POSITIVE | 0 | NEGATIVE | 0 |
| J | C | DECREASE | | INCREASE | | DECREASE | C |

According to the first derivative tests, the quadratic expression $\alpha_k \theta_k^2 + \beta_k \theta_k + \gamma_k \theta_k$ always has two distinct real roots unless $\alpha_k$ is 0. However, if $\alpha_k$ is accidentally equal to 0 or close to 0, the root finding is numerically unstable. In this case, a zero is employed as the root $\theta_k$.

A description is now given mainly of the difference of a rechargeable battery parameter estimation apparatus 101 according to the fifth embodiment from the rechargeable battery parameter estimation apparatus 101 according to the fourth embodiment.

Figure 26:
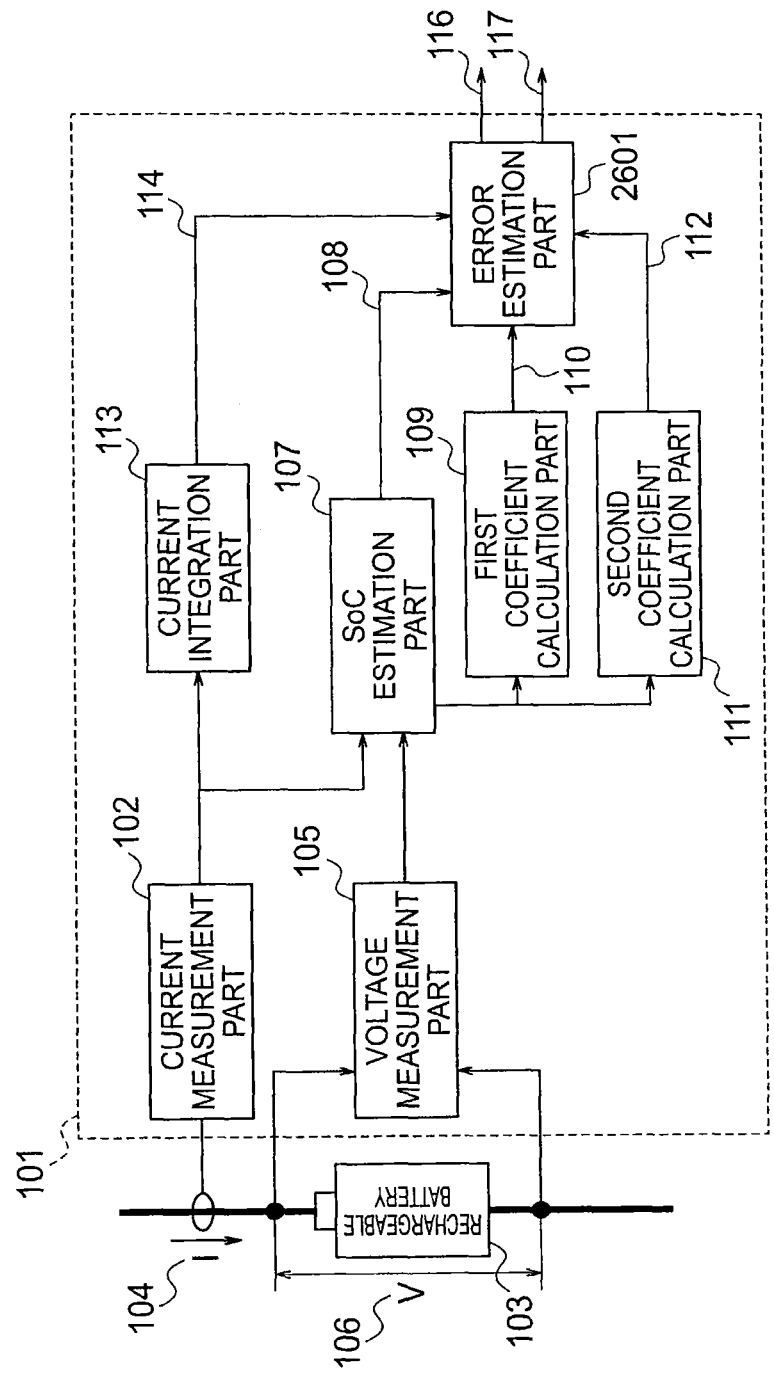
FIG. 26 is an overall configuration diagram of a rechargeable battery parameter estimation apparatus according to a fifth embodiment of the present invention.

FIG. 26 is an overall configuration diagram of the rechargeable battery parameter estimation apparatus 101 according to the fifth embodiment of the present invention. The rechargeable battery parameter estimation apparatus 101 according to the fifth embodiment has the same configuration as that of the rechargeable battery parameter estimation apparatus 101 according to the fourth embodiment except for an error estimation part 2601.

Figure 27:
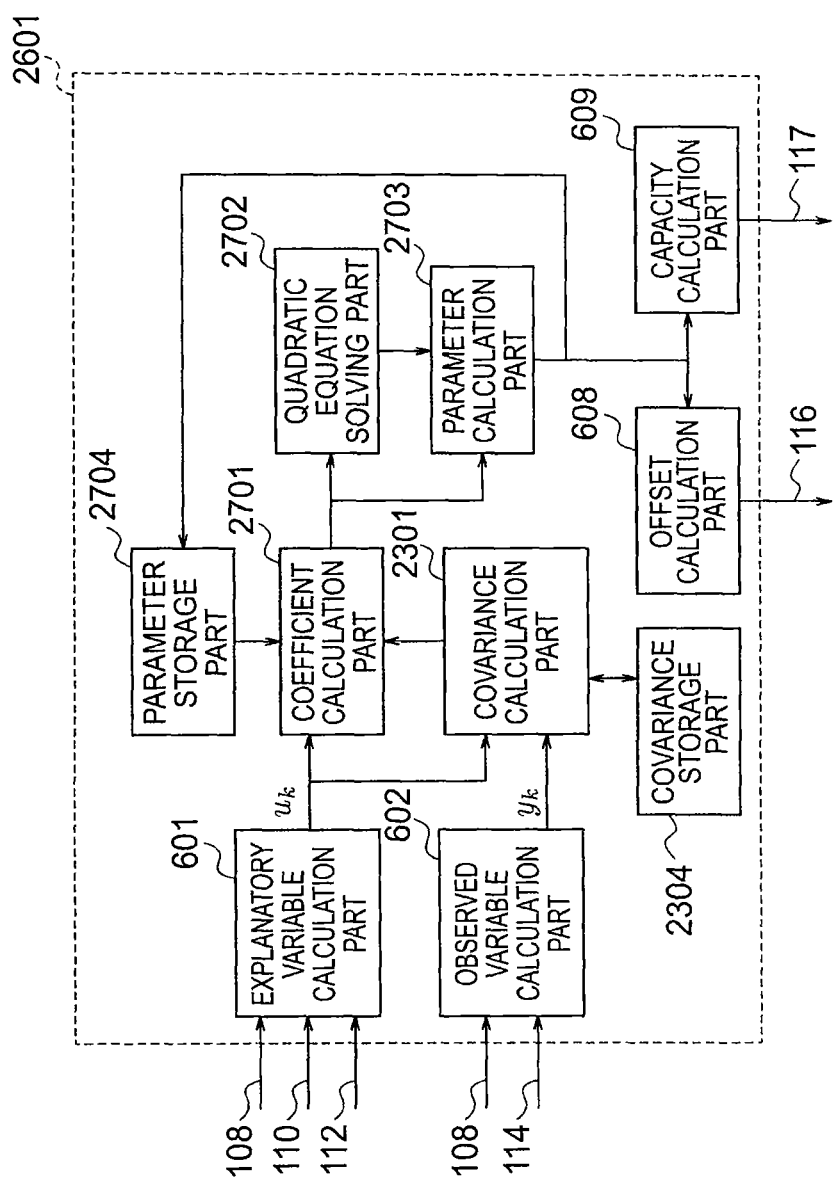
FIG. 27 is an overall configuration diagram of an error estimation part according to the fifth embodiment of the present invention.

FIG. 27 is an overall configuration diagram of the error estimation part 2601 according to the fifth embodiment of the present invention. The explanatory variable calculation part 601 and the observed variable calculation part 602 are the same as those of the first embodiment. The variance calculation part 2301 and the variance storage part 2304 are the same as those of the fourth embodiment.

A coefficient calculation part 2701 calculates the coefficients $\alpha_k$, $\beta_k$, and $\gamma_k$ of the quadratic expression by Equations (78), (79), and (80) from the explanatory variable $u_k$ calculated by the explanatory variable calculation part 601, the covariance matrix $R_k$ calculated by the covariance calculation part 2301, and the parameter estimated value $\hat{p}_{k-1}$ at the previous sampling stored in the parameter storage part 2704.

A quadratic expression solving part 2702 acquires the real root $\theta^+_k$ of the quadratic expression having the coefficients calculated by the coefficient calculation part 2701 by the second equation of Equation (81).

A parameter calculation part 2703 calculates the estimated parameter vector $\hat{p}_k$ by Equation (74) from the coefficients of the quadratic expression calculated by the coefficient calculation part 2701 and the real root $\theta^+_k$ of the quadratic expression found by the quadratic expression solving part 2702, and stores the estimated parameter vector $\hat{p}_k$ in a parameter storage part 2704. It should be noted that if the coefficient of the second order term of the quadratic expression is almost 0, $\hat{p}_k$ is set to $\hat{p}_{k-1}$. The offset calculation part 608 and the capacity calculation part 609 are the same as those of the first embodiment.

Figure 28:
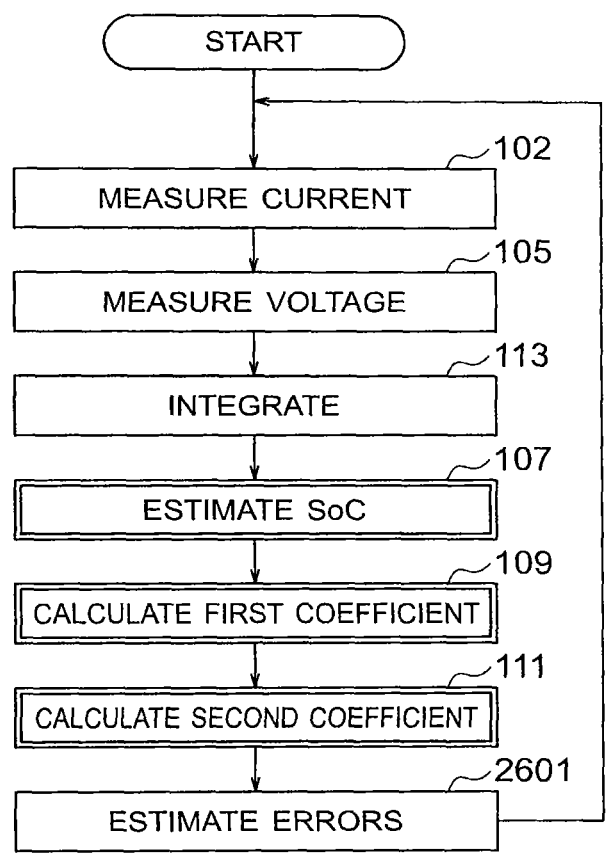
FIG. 28 is a flowchart of a rechargeable battery parameter estimation method according to the fifth embodiment of the present invention.

FIG. 28 is a flowchart of a rechargeable battery parameter estimation method according to the fifth embodiment of the present invention. Each step of the flowchart corresponds to a processing executed by the corresponding part of the rechargeable battery parameter estimation apparatus 101 illustrated in FIG. 26. It should be noted that an execution sequence of the rechargeable battery parameter estimation apparatus 101 according to the fifth embodiment is not limited to the execution sequence illustrated in FIG. 28. The execution sequence of the steps can be shuffled as long as the dependencies among the steps are not violated.

Figure 29:
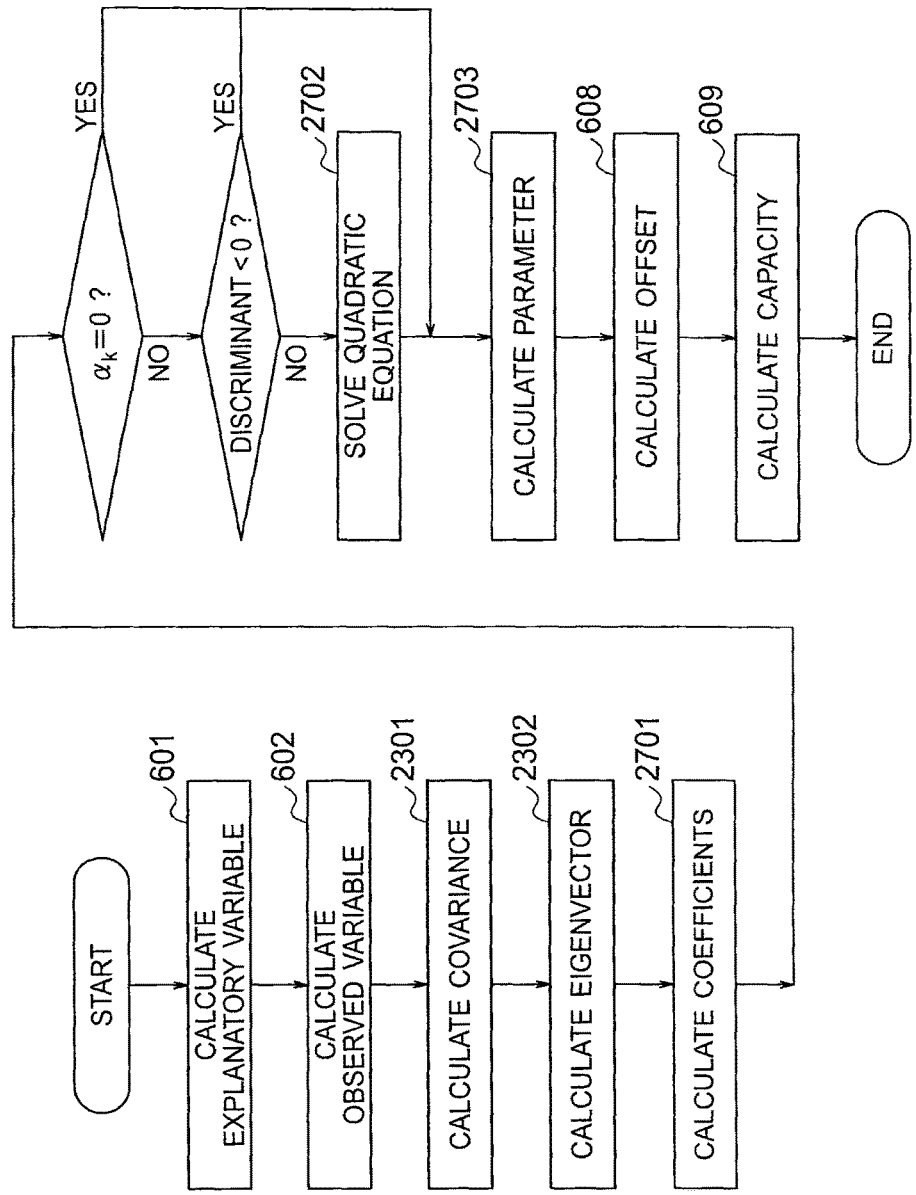
FIG. 29 is a flowchart of a processing executed by the error estimation part in a cycle of periodic operations according to the fifth embodiment of the present invention.

FIG. 29 is a flowchart of a processing executed by the error estimation part 2601 in a cycle of periodic operations according to the fifth embodiment of the present invention. Each step of the flowchart corresponds to a processing executed by the corresponding part of the error estimation part 2601 illustrated in FIG. 27. It should be noted that an execution sequence of the error estimation part 2601 according to the fifth embodiment is not limited to the execution sequence illustrated in FIG. 29. The execution sequence of the steps can be shuffled as long as the dependencies among the steps are not violated.

The fifth embodiment can be combined with the second embodiment.

As described above, according to the fifth embodiment, the estimated parameter vector $\hat{p}_k$ is calculated without solving the generalized eigenvalue problem, and the same effects as those of the fourth embodiment can be provided. As a result, the calculation complexity can be reduced, and the fifth embodiment is appropriate for an software implementation in embedded systems.

What is claimed is:

1. A rechargeable battery parameter estimation apparatus for a rechargeable battery, the rechargeable battery parameter estimation apparatus comprising:
   voltage measurement circuitry configured to measure a voltage between terminals of the rechargeable battery;
   current measurement circuitry configured to measure a current flowing through the rechargeable battery, the measurement of the current having an offset error; and
   a microcontroller configured to access memory and electrically coupled to outputs of the voltage measurement circuitry and the current measurement circuitry,
   wherein:
   the microcontroller is configured to:
   estimate an estimated value of the state-of-charge of the rechargeable battery dependent on a typical full charge capacity of the rechargeable battery measured in advance and the measured voltage between the terminals of the rechargeable battery, the typical full charge capacity having a capacity error,
   calculate a first coefficient, which is a partial derivative of the estimated value of the state-of-charge with respect to the offset error of the current measurement,
   calculate a second coefficient, which is a partial derivative of the estimated value of the state-of-charge with respect to the capacity error, the capacity error being a difference of the typical full charge capacity measured in advance from an actual full charge capacity of the rechargeable battery when the rechargeable battery is in use,
   estimate the offset error of the current measurement and the capacity error from derivative information including the first coefficient and the second coefficient, the current flowing through the rechargeable battery, and the estimated value of the state-of-charge, and
   perform a degradation assessment of the rechargeable battery based on the estimated offset error and the estimated capacity error.

2. A rechargeable battery parameter estimation apparatus according to claim 1, wherein:
   the microcontroller is configured to calculate a current integration value by integrating the current measured by the current measurement circuitry, and
   the offset error and the capacity error are estimated from the derivative information, the current integration value, and the estimated value of the state-of-charge.

3. A rechargeable battery parameter estimation apparatus according to claim 1, wherein:
   the offset error and the capacity error are estimated from a difference between a current calculated value and a previous calculated value of the derivative information, a difference between a current calculated value and a previous calculated value of the estimated value of the state-of-charge, and the current flowing through the rechargeable battery.

4. A rechargeable battery parameter estimation apparatus according to claim 1, wherein:
   the estimated value of the state-of-charge of the rechargeable battery is estimated from the typical full charge capacity, the voltage between terminals of the rechargeable battery, and a characteristic parameter of an equivalent circuit of the rechargeable battery measured in advance,
   the microcontroller is configured to calculate a third coefficient, which is a partial derivative of the estimated value of the state-of-charge with respect to a difference between a typical value and an actual value of the characteristic parameter of the equivalent circuit of the rechargeable battery, and
   the referred to derivative information includes the first coefficient, the second coefficient, and the third coefficient.

5. A rechargeable battery parameter estimation apparatus according to claim 2, wherein:
   the state-of-charge of the rechargeable battery is estimated from the typical full charge capacity, the voltage between terminals of the rechargeable battery, and a characteristic parameter of an equivalent circuit of the rechargeable battery measured in advance,
   the microcontroller is configured to calculate a third coefficient, which is a partial derivative of the estimated value of the state-of-charge with respect to a difference between a typical value and an actual value of the characteristic parameter of the equivalent circuit of the rechargeable battery, and the derivative information includes the first coefficient, the second coefficient, and the third coefficient.

6. A rechargeable battery parameter estimation apparatus according to claim 3, wherein:
the estimated value of the state-of-charge of the rechargeable battery is estimated from the typical full charge capacity, the voltage between terminals of the rechargeable battery, and a characteristic parameter of an equivalent circuit of the rechargeable battery measured in advance,
the microcontroller is configured to calculate a third coefficient, which is a partial derivative of the estimated value of the state-of-charge with respect to a difference between a typical value and an actual value of the characteristic parameter of the equivalent circuit of the rechargeable battery, and
the derivative information includes the first coefficient, the second coefficient, and the third coefficient.

7. A rechargeable battery parameter estimation apparatus according to claim 1, wherein:
a Kalman filter is used to estimate the estimated value of the state-of-charge of the rechargeable battery.

8. A rechargeable battery parameter estimation apparatus according to claim 2, wherein:
a Kalman filter is used to estimate the estimated value of the state-of-charge of the rechargeable battery.

9. A rechargeable battery parameter estimation apparatus according to claim 3, wherein:
a Kalman filter is used to estimate the estimated value of the state-of-charge of the rechargeable battery.

10. A rechargeable battery parameter estimation apparatus according to claim 1, wherein:
the microcontroller is configured to:
calculate an explanatory variable from: one of the derivative information and a difference between a current calculated value and a previous calculated value of the derivative information; and one of the estimated value of the state-of-charge and a difference between a current calculated value and a previous calculated value of the estimated value of the state-of-charge,
calculate an observed variable from: one of the derivative information and the difference between the current calculated value and the previous calculated value of the derivative information; and one of the estimated value of the state-of-charge and the difference between the current calculated value and the previous calculated value of the estimated value of the state-of-charge,
calculate an estimated parameter vector, which is an estimated value of a parameter relating to the offset error and the capacity error, based on the explanatory variable and the observed variable,
correct the offset error using the estimated parameter vector, and
estimate the capacity error using the estimated parameter vector.

11. A rechargeable battery parameter estimation apparatus according to claim 2, wherein:
the microcontroller is configured to:
calculate an explanatory variable from: one of the derivative information and a difference between a current calculated value and a previous calculated value of the derivative information; and one of the estimated value of the state-of-charge and a difference between a current calculated value and a previous calculated value of the estimated value of the state-of-charge,
calculate an observed variable from: one of the derivative information and the difference between the current calculated value and the previous calculated value of the derivative information; and one of the estimated value of the state-of-charge and the difference between the current calculated value and the previous calculated value of the estimated value of the state-of-charge,
calculate an estimated parameter vector, which is an estimated value of a parameter relating to the offset error and the capacity error, based on the explanatory variable and the observed variable,
correct the offset error using the estimated parameter vector, and
estimate the capacity error using the estimated parameter vector.

12. A rechargeable battery parameter estimation apparatus according to claim 3, wherein:
the microcontroller is configured to:
calculate an explanatory variable from: one of the derivative information and the difference between the current calculated value and the previous calculated value of the derivative information; and one of the estimated value of the state-of-charge and the difference between the current calculated value and the previous calculated value of the estimated value of the state-of-charge,
calculate an observed variable from: one of the derivative information and the difference between the current calculated value and the previous calculated value of the derivative information; and one of the estimated value of the state-of-charge and the difference between the current calculated value and the previous calculated value of the estimated value of the state-of-charge,
calculate an estimated parameter vector, which is an estimated value of a parameter relating to the offset error and the capacity error, based on the explanatory variable and the observed variable,
correct the offset error using the estimated parameter vector, and
estimate the capacity error using the estimated parameter vector.

13. A rechargeable battery parameter estimation apparatus according to claim 10, wherein:
the microcontroller is configured to:
calculate a recursive least squares gain from the explanatory variable and an inverse variance in a previous cycle of periodic operations performed previous to a current cycle of periodic operations, and
calculate the inverse variance from the inverse variance in the previous cycle of periodic operations, the recursive least squares gain, and the explanatory variable, and
the estimated parameter vector is calculated from the explanatory variable, the observed variable, the recursive least squares gain, and an estimated parameter vector in the previous cycle of periodic operations.

14. A rechargeable battery parameter estimation apparatus according to claim 11, wherein:
the microcontroller is configured to:
calculate a recursive least squares gain from the explanatory variable and an inverse variance in a previous cycle of periodic operations performed previous to a current cycle of periodic operations, and
calculate the inverse variance from the inverse variance in the previous cycle of periodic operations, the recursive least squares gain, and the explanatory variable, and
the estimated parameter vector is calculated from the explanatory variable, the observed variable, the recursive least squares gain, and an estimated parameter vector in the previous cycle of periodic operations.

15. A rechargeable battery parameter estimation apparatus according to claim 12, wherein:
the microcontroller is configured to:
calculate a recursive least squares gain from the explanatory variable and an inverse variance in a previous cycle of periodic operations performed previous to a current cycle of periodic operations, and
calculate the inverse variance from the inverse variance in the previous cycle of periodic operations, the recursive least squares gain, and the explanatory variable, and
the estimated parameter vector is calculated from the explanatory variable, the observed variable, the recursive least squares gain, and an estimated parameter vector in the previous cycle of periodic operations.

16. A rechargeable battery parameter estimation apparatus according to claim 10, wherein:
the microcontroller is configured to:
calculate a covariance matrix from the explanatory variable, the observed variable, and a covariance matrix in a previous cycle of periodic operations performed previous to a current cycle of periodic operations, and
calculate an eigenvector corresponding to a minimum eigenvalue of the covariance matrix by solving an eigenvalue problem relating to the covariance matrix, and
the estimated parameter vector is calculated from the eigenvector.

17. A rechargeable battery parameter estimation apparatus according to claim 11, wherein:
the microcontroller is configured to:
calculate a covariance matrix from the explanatory variable, the observed variable, and a covariance matrix in a previous cycle of periodic operations performed previous to a current cycle of periodic operations, and
calculate an eigenvector corresponding to a minimum eigenvalue of the covariance matrix by solving an eigenvalue problem relating to the covariance matrix, and
the estimated parameter vector is calculated from the eigenvector.

18. A rechargeable battery parameter estimation apparatus according to claim 12, wherein:
the microcontroller is configured to:
calculate a covariance matrix from the explanatory variable, the observed variable, and a covariance matrix in a previous cycle of periodic operations performed previous to a current cycle of periodic operations, and
calculate an eigenvector corresponding to a minimum eigenvalue of the covariance matrix by solving an eigenvalue problem relating to the covariance matrix, and
the estimated parameter vector is calculated from the eigenvector.

19. A rechargeable battery parameter estimation apparatus according to claim 10, wherein:
the microcontroller is configured to:
calculate a covariance matrix from the explanatory variable, the observed variable, and a covariance matrix in a previous cycle of periodic operations performed previous to a current cycle of periodic operations,
calculate coefficients of a quadratic expression for acquiring the estimated parameter vector from the explanatory variable, the covariance matrix, and an estimated parameter vector in the previous cycle of periodic operations, and
acquire a real root of a quadratic expression having the coefficients of the quadratic expression, and
the estimated parameter vector is calculated from the coefficients of the quadratic expression and the real root of the quadratic expression.

20. A rechargeable battery parameter estimation apparatus according to claim 11, wherein:
the microcontroller is configured to:
calculate a covariance matrix from the explanatory variable, the observed variable, and a covariance matrix in a previous cycle of periodic operations performed previous to a current cycle of periodic operations,
calculate coefficients of a quadratic expression for acquiring the estimated parameter vector from the explanatory variable, the covariance matrix, and an estimated parameter vector in the previous cycle of periodic operations, and
acquire a real root of a quadratic expression having the coefficients of the quadratic expression, and
the estimated parameter vector is calculated from the coefficients of the quadratic expression and the real root of the quadratic expression.

21. A rechargeable battery parameter estimation apparatus according to claim 12, wherein:
the microcontroller is configured to:
calculate a covariance matrix from the explanatory variable, the observed variable, and a covariance matrix in a previous cycle of periodic operations performed previous to a current cycle of periodic operations,
calculate coefficients of a quadratic expression for acquiring the estimated parameter vector from the explanatory variable, the covariance matrix, and an estimated parameter vector in the previous cycle of periodic operations, and
acquire a real root of a quadratic expression having the coefficients of the quadratic expression, and
the estimated parameter vector is calculated from the coefficients of the quadratic expression and the real root of the quadratic expression.

22. A rechargeable battery parameter estimation method for a rechargeable battery, the rechargeable battery parameter estimation method comprising:
measuring, using voltage measurement circuitry, a voltage between terminals of the rechargeable battery;
measuring, using current measurement circuitry, a current flowing through the rechargeable battery, the measurement of the current having an offset error;
estimating, using a microprocessor in communication with memory and electrically coupled to outputs of the voltage measurement circuitry and the current measurement circuitry, an estimated value of a state-of-charge of the rechargeable battery dependent on a typical full charge capacity of the rechargeable battery measured in advance and the measured voltage between the terminals of the rechargeable battery, the typical full charge capacity having a capacity error;
calculating, using the microprocessor, a first coefficient, which is a partial derivative of the estimated value of the state-of-charge with respect to the offset error of the current measurement;

calculating, using the microprocessor, a second coefficient, which is a partial derivative of the estimated value of the state-of-charge with respect to the capacity error, the capacity error being a difference of the typical full charge capacity measured in advance from an actual full charge capacity of the rechargeable battery when the rechargeable battery is in use;

estimating, using the microprocessor, the offset error of the current measurement and the capacity error from derivative information including the first coefficient and the second coefficient, the current flowing through the rechargeable battery, and the estimated value of the state-of-charge;

outputting the estimated offset error and the estimated capacity error; and performing a degradation assessment of the rechargeable battery based on the outputted offset error and the outputted capacity error.

* * * * *